United States Patent
Master et al.

(10) Patent No.: US 7,961,226 B2
(45) Date of Patent: Jun. 14, 2011

(54) SYSTEM FOR ADAPTING DEVICE STANDARDS AFTER MANUFACTURE

(75) Inventors: Paul L. Master, Sunnyvale, CA (US); John Watson, Edgewood, WA (US)

(73) Assignee: QST Holdings, Inc., San Jose, CA (US)

( * ) Notice: Subject to any disclaimer, the term of this patent is extended or adjusted under 35 U.S.C. 154(b) by 80 days.

(21) Appl. No.: 12/560,018

(22) Filed: Sep. 15, 2009

(65) Prior Publication Data
US 2010/0002100 A1 Jan. 7, 2010

Related U.S. Application Data

(63) Continuation of application No. 10/606,031, filed on Jun. 25, 2003, now Pat. No. 7,609,297.

(51) Int. Cl.
*H04N 5/228* (2006.01)
(52) U.S. Cl. ............... 348/222.1; 712/29; 712/15
(58) Field of Classification Search ............... 348/222.1, 348/207.99; 712/15, 29, 202, 200; 345/506; 709/201; 713/100
See application file for complete search history.

(56) References Cited

U.S. PATENT DOCUMENTS

| | | | | |
|---|---|---|---|---|
| 5,694,613 | A | * | 12/1997 | Suzuki ................. 712/231 |
| 7,142,731 | B1 | * | 11/2006 | Toi ..................... 382/307 |
| 2003/0051123 | A1 | * | 3/2003 | Takamuki ............. 712/228 |
| 2006/0225002 | A1 | * | 10/2006 | Hassoun et al. ........ 716/1 |

* cited by examiner

*Primary Examiner* — Nelson D. Hernández Hernández
(74) *Attorney, Agent, or Firm* — Nixon Peabody LLP

(57) ABSTRACT

The present invention provides a digital imaging apparatus having an optical sensor, an analog-to-digital converter, a plurality of computational elements, and an interconnection network. The optical sensor converts an object image into a detected image, which is then converted to digital image information by the analog-to-digital converter. The plurality of computational elements includes a first computational element having a first fixed architecture and a second computational element having a second, different fixed architecture. The interconnection network is capable of providing a processed digital image from the digital image information by configuring and reconfiguring the plurality of computational elements for performance of a plurality of different imaging functions. The invention may be embodied, for example, as a digital camera, a scanner, a printer, or a dry copier.

20 Claims, 25 Drawing Sheets

ADAPTIVE COMPUTING ENGINE (ACE)

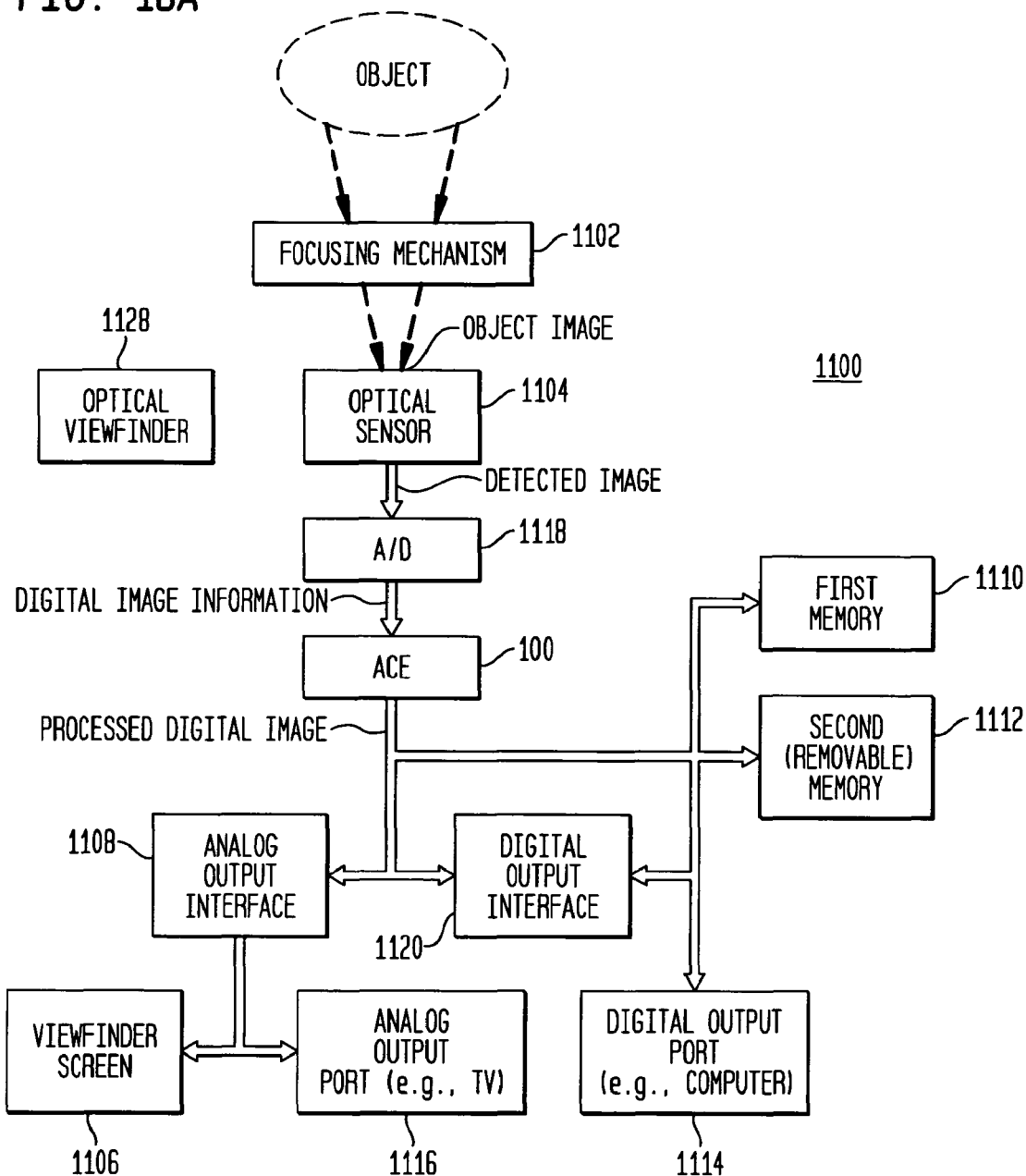

SYSTEM FOR ADAPTING DEVICE STANDARDS AFTER MANUFACTURE

CROSS REFERENCE TO A RELATED APPLICATION

This application is related to a Paul L. Master et al., U.S. patent application Ser. No. 10/384,486, entitled "Adaptive Integrated Circuitry With Heterogeneous And Reconfigurable Matrices Of Diverse And Adaptive Computational Units Having Fixed, Application Specific Computational Elements", filed Mar. 7, 2003, commonly assigned to QuickSilver Technology, Inc., and incorporated by reference herein, which is a continuation-in-part of Paul L. Master et al., U.S. patent application Ser. No. 09/815,122, entitled "Adaptive Integrated Circuitry With Heterogeneous And Reconfigurable Matrices Of Diverse And Adaptive Computational Units Having Fixed, Application Specific Computational Elements", filed Mar. 22, 2001, now U.S. Pat. No. 6,836,839, commonly assigned to QuickSilver Technology, Inc.

FIELD OF THE INVENTION

The present invention relates, in general, to digital imaging and, more particularly, to digital imaging and other optical applications using adaptive integrated circuitry with heterogeneous and reconfigurable matrices of diverse and adaptive computational units having fixed, application specific computational elements.

BACKGROUND OF THE INVENTION

The related application discloses a new form or type of integrated circuit, referred to as an adaptive computing engine ("ACE"), which is readily reconfigurable, in real time, and is capable of having corresponding, multiple modes of operation.

The ACE architecture for adaptive or reconfigurable computing, includes a plurality of different or heterogeneous computational elements coupled to an interconnection network. The plurality of heterogeneous computational elements include corresponding computational elements having fixed and differing architectures, such as fixed architectures for different functions such as memory, addition, multiplication, complex multiplication, subtraction, configuration, reconfiguration, control, input, output, and field programmability. In response to configuration information, the interconnection network is operative in real time to adapt (configure and reconfigure) the plurality of heterogeneous computational elements for a plurality of different functional modes, including linear algorithmic operations, non-linear algorithmic operations, finite state machine operations, memory operations, and bit-level manipulations.

The ACE architecture provides a single IC, which may be adapted in real time, using these fixed and application specific computational elements, to perform a wide variety of tasks. For example, utilizing differing configurations over time of the same set of heterogeneous computational elements, the ACE architecture may implement functions such as finite impulse response filtering, fast Fourier transformation, discrete cosine transformation, and with other types of computational elements, may implement many other high level processing functions for advanced communications and computing.

Digital image processing is a comparatively recent field, and includes devices such as digital cameras, digital scanners, facsimile (fax) machines, and copying machines. Conventional digital image processing, however, utilizes conventional processing technology, such as digital signal processors ("DSPs"), microprocessors, or application-specific integrated circuits ("ASICs"). As a consequence, a need remains for digital image processing using an adaptive computing circuit architecture, such as using the ACE architecture of the related application.

SUMMARY OF THE INVENTION

The present invention provides a digital imaging apparatus which may be embodied, for example, as a digital camera, a scanner, a printer, a dry copier, or otherwise utilized in digital imaging applications. The digital imaging apparatus of the invention includes an optical sensor, an analog-to-digital converter, a plurality of computational elements, and an interconnection network. The optical sensor is capable of converting an object image into a detected image. The analog-to-digital converter is coupled to the optical sensor and is capable of converting the detected image to digital image information. The plurality of computational elements includes a first computational element having a first fixed architecture and a second computational element having a second fixed architecture, with the first fixed architecture being different than the second fixed architecture. The interconnection network is coupled to the plurality of computational elements and to the analog-to-digital converter, and is capable of providing a processed digital image from the digital image information by configuring the plurality of computational elements for performance of a first imaging function of a plurality of imaging functions in response to first configuration information, and by reconfiguring the plurality of computational elements for performance of a second imaging function of the plurality of imaging functions in response to second configuration information, with the first imaging function being different than the second imaging function.

The digital imaging apparatus may also include focusing means capable of providing the object image to the optical sensor, such as a focusing assembly having a lens, a shutter, an aperture, and a focusing motor. The optical sensor is at least one of a plurality of optical sensors, such as a charge coupled device (CCD), a charge injection device (CID), an optical complementary metal oxide silicon (CMOS) array, an optical bipolar junction transistor (BJT) array, a photogate array, or a photodiode array.

The digital imaging apparatus, in various embodiments, may also include an analog output interface coupled to the interconnection network, the analog output interface capable of converting the processed digital image to an analog form; a viewfinder screen coupled to the analog output interface, the viewfinder screen capable of visually displaying the analog form of the processed digital image; and an analog output port coupled to the analog output interface, the analog output port capable of outputting the analog form of the processed digital image, such as for connection to a television or other video display. The digital imaging apparatus may also include a digital output port coupled to the interconnection network, the digital output port capable of outputting the processed digital image, such as for connection to a computer or a data transmission device.

The processed digital image may also be provided as a plurality of processed digital image data packets. In this embodiment, the digital imaging apparatus may also include a digital output interface coupled to the interconnection network, with the digital output interface capable of selecting a plurality of processed digital image data words from the plurality of processed digital image data packets and assembling the plurality of processed digital image data words to form the processed digital image.

The digital imaging apparatus also may be included within or coupled to, for example: a printer capable of printing the processed digital image on a tangible medium; a dry copier capable of transferring the processed digital image to a tangible medium; a data transmitter capable of transmitting the processed digital image to a remote location; a scanner capable of transferring the processed digital image to a storage medium, to a computer, and so on.

In the various embodiments, the plurality of imaging functions may include one or more of the following functions: linear filtering; nonlinear filtering; morphological filtering; median filtering; local weighted median filtering; center weighted median filtering; vector weighted median filtering; multichannel image recovery; multiframe image restoration; iterative image restoration; motion detection; motion estimation; low pass filtering; multirate filtering; wavelet-based multirate filtering; autofocusing; contrast enhancement; blur removal.

Also in the various embodiments, the first fixed architecture and the second fixed architecture of the a plurality of computational elements may be selected from a plurality of specific architectures, such as those architectures having the following corresponding functions: linear filtering, non-linear filtering, memory, addition, multiplication, complex multiplication, subtraction, synchronization, queuing, over sampling, under sampling, adaptation, configuration, reconfiguration, control, input, output, and field programmability.

Various types of memory may be included within the digital imaging apparatus. For example, a first memory may be couplable to the interconnection network and capable of storing the processed digital image, and this first memory may be a selectively removable flash memory. A second memory may also be included, coupled to the interconnection network, and be capable of storing the first configuration information and the second configuration information, such as synchronous dynamic random access memory (SDRAM).

In another embodiment, the digital imaging apparatus includes an optical sensor, an analog-to-digital converter, an input pipeline register, a first memory, a hardware task manager, a data distributor, an adaptive execution unit, a data selector, and an output pipeline register. The optical sensor is also capable of converting an object image into a detected image. The analog-to-digital converter is coupled to the optical sensor and is capable of converting the detected image to a plurality of digital image information data packets. The input pipeline register is coupled to the analog-to-digital converter and is capable of receiving the plurality of digital image information data packets, while the first memory is capable of storing the plurality of digital image information data packets. The hardware task manager is capable of processing a plurality of imaging tasks and determining that a first imaging task from the plurality of imaging tasks is capable of being performed and that a second imaging task from the plurality of imaging tasks is capable of being performed, with the first imaging task being different than the second imaging task. The data distributor is coupled to the input pipeline register, to the first memory, and to the hardware task manager, and is capable of distributing the plurality of digital image information data packets to the first memory. The adaptive execution unit is coupled to the hardware task manager and to the first memory, and is capable of configuring to perform the first imaging task and capable of performing the first imaging task using the plurality of digital image information data packets, the adaptive execution unit further capable of reconfiguring to perform the second imaging task and capable of performing the second imaging task, and the adaptive execution unit further capable of generating a corresponding plurality of processed digital image data packets from the performance of the first imaging task and the second imaging task. The data selector is coupled to the hardware task manager, to the adaptive execution unit and to the first memory, and is capable of determining routing for the corresponding plurality of processed digital image data packets. The output pipeline register is coupled to the data selector, and is capable of receiving the corresponding plurality of processed digital image data packets.

In this embodiment, the adaptive execution unit includes a plurality of computational elements and a plurality of switching elements coupled to the plurality of computational elements. In the plurality of computational elements, a first computational element has a first fixed architecture and a second computational element has a second fixed architecture, with the first fixed architecture being different from the second fixed architecture. The plurality of switching elements are capable of configuring the plurality of computational elements for performance of a first imaging function of a plurality of imaging functions in response to first configuration information, and are further capable of reconfiguring the plurality of computational elements for performance of a second imaging function of the plurality of imaging functions in response to second configuration information, with the first imaging function being different than the second imaging function.

Numerous other advantages and features of the present invention will become readily apparent from the following detailed description of the invention and the embodiments thereof, from the claims and from the accompanying drawings.

BRIEF DESCRIPTION OF THE DRAWINGS

FIG. 16A is a block diagram of an exemplary digital camera in accordance with the present invention.

DETAILED DESCRIPTION OF THE INVENTION

Figure 1:
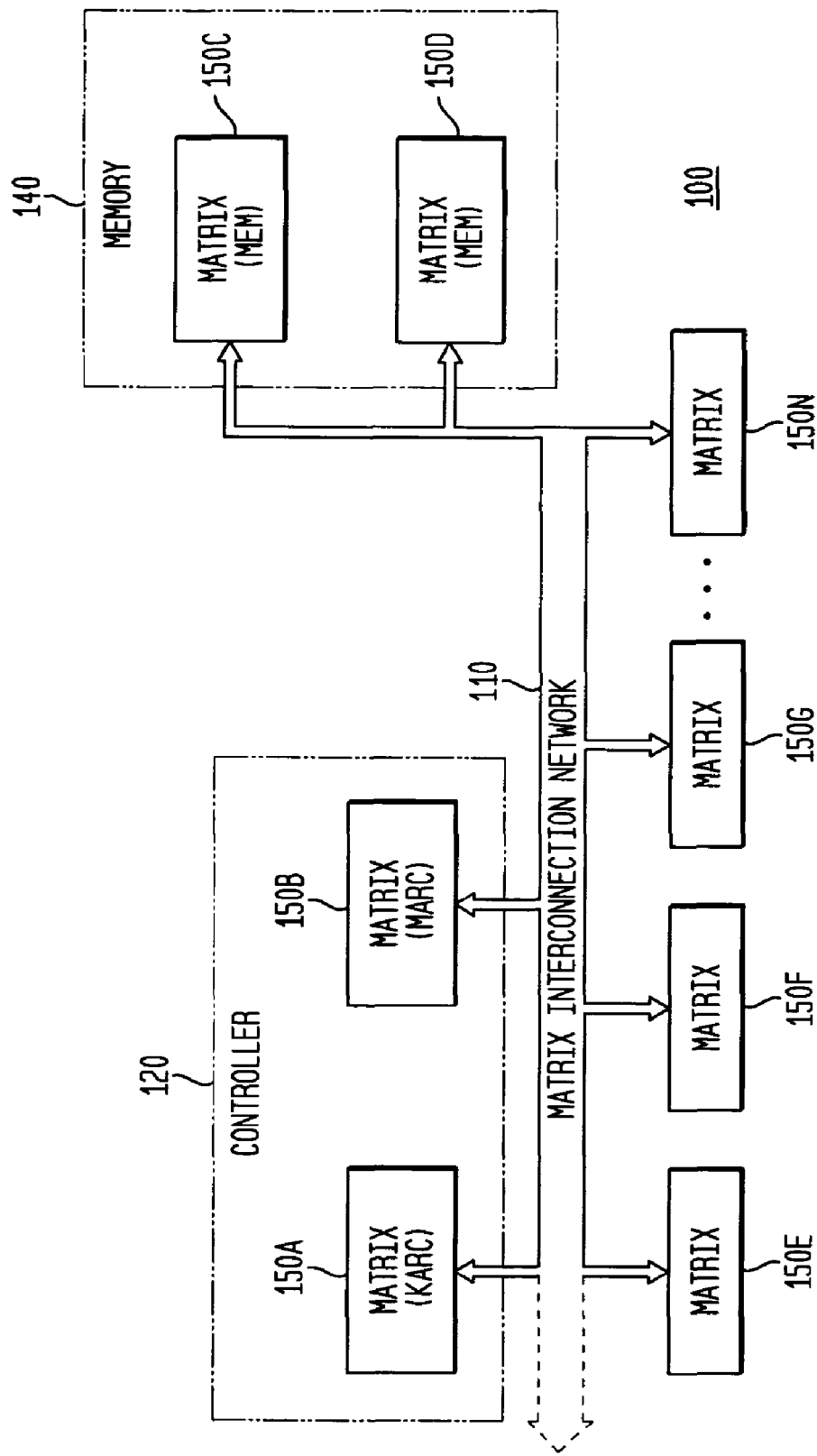
FIG. 1 is a block diagram illustrating an exemplary first apparatus embodiment in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

The present invention provides digital image processing using an adaptive computing architecture such as the ACE architecture. The adaptive computing architecture of the invention uses a plurality of computational elements, which themselves have fixed architectures, in conjunction with an interconnection network, to configure and reconfigure the same computational elements to perform a wide variety of functions and operations which, in this case, pertain to digital image processing. The ACE architecture, for example, may be configured and reconfigured to process an optically detected image to provide a processed digital image, such as for use in a digital camera, a video camera, video telephony applications, digital TV, digital cinema, a fax machine, a photocopier, or any number of other devices that create or reproduce an image from visible spectrum (light) signals.

FIG. 1 is a block diagram illustrating a first apparatus 100 embodiment in accordance with the present invention. The apparatus 100, referred to herein as an adaptive computing engine ("ACE") 100, is preferably embodied as an integrated circuit, or as a portion of an integrated circuit having other, additional components. In the first apparatus embodiment, and as discussed in greater detail below, the ACE 100 includes one or more reconfigurable matrices (or nodes) 150, such as matrices 150A through 150N as illustrated, and a matrix interconnection network 110. Also in the first apparatus embodiment, and as discussed in detail below, one or more of the matrices (nodes) 150, such as matrices 150A and 150B, are configured for functionality as a controller 120, while other matrices, such as matrices 150C and 150D, are configured for functionality as a memory 140. The various matrices 150 and matrix interconnection network 110 may also be implemented together as fractal subunits, which may be scaled from a few nodes to thousands of nodes.

A significant departure from the prior art, the ACE 100 does not utilize traditional (and typically separate) data, direct memory access (DMA), random access, configuration and instruction busses for signaling and other transmission between and among the reconfigurable matrices 150, the controller 120, and the memory 140, or for other input/output ("I/O") functionality. Rather, data, control and configuration information are transmitted between and among these matrix 150 elements, utilizing the matrix interconnection network 110, which may be configured and reconfigured, in real time, to provide any given connection between and among the reconfigurable matrices 150, including those matrices 150 configured as the controller 120 and the memory 140, as discussed in greater detail below.

The matrices 150 configured to function as memory 140 may be implemented in any desired or preferred way, utilizing computational elements (discussed below) of fixed memory elements, and may be included within the ACE 100 or incorporated within another IC or portion of an IC. In the first apparatus embodiment, the memory 140 is included within the ACE 100, and preferably is comprised of computational elements which are low power consumption random access memory (RAM), but also may be comprised of computational elements of any other form of memory, such as flash, DRAM, SRAM, SDRAM, FeRAM, MRAM, ROM, EPROM or $E^2$PROM. In the first apparatus embodiment, the memory 140 preferably includes DMA engines, not separately illustrated.

The controller 120 is preferably implemented, using matrices 150A and 150B configured as adaptive finite state machines, as a reduced instruction set ("RISC") processor, controller or other device or IC capable of performing the two types of functionality discussed below. (Alternatively, these functions may be implemented utilizing a conventional RISC or other processor.) The first control functionality, referred to as "kernel" control, is illustrated as kernel controller ("KARC") of matrix 150A, and the second control functionality, referred to as "matrix" control, is illustrated as matrix controller ("MARC") of matrix 150B. The kernel and matrix control functions of the controller 120 are explained in greater detail below, with reference to the configurability and reconfigurability of the various matrices 150, and with reference to the exemplary form of combined data, configuration and control information referred to herein as a "silverware" module. The kernel controller is also referred to as a "K-node", discussed in greater detail below with reference to FIGS. 10 and 11.

Figure 3:
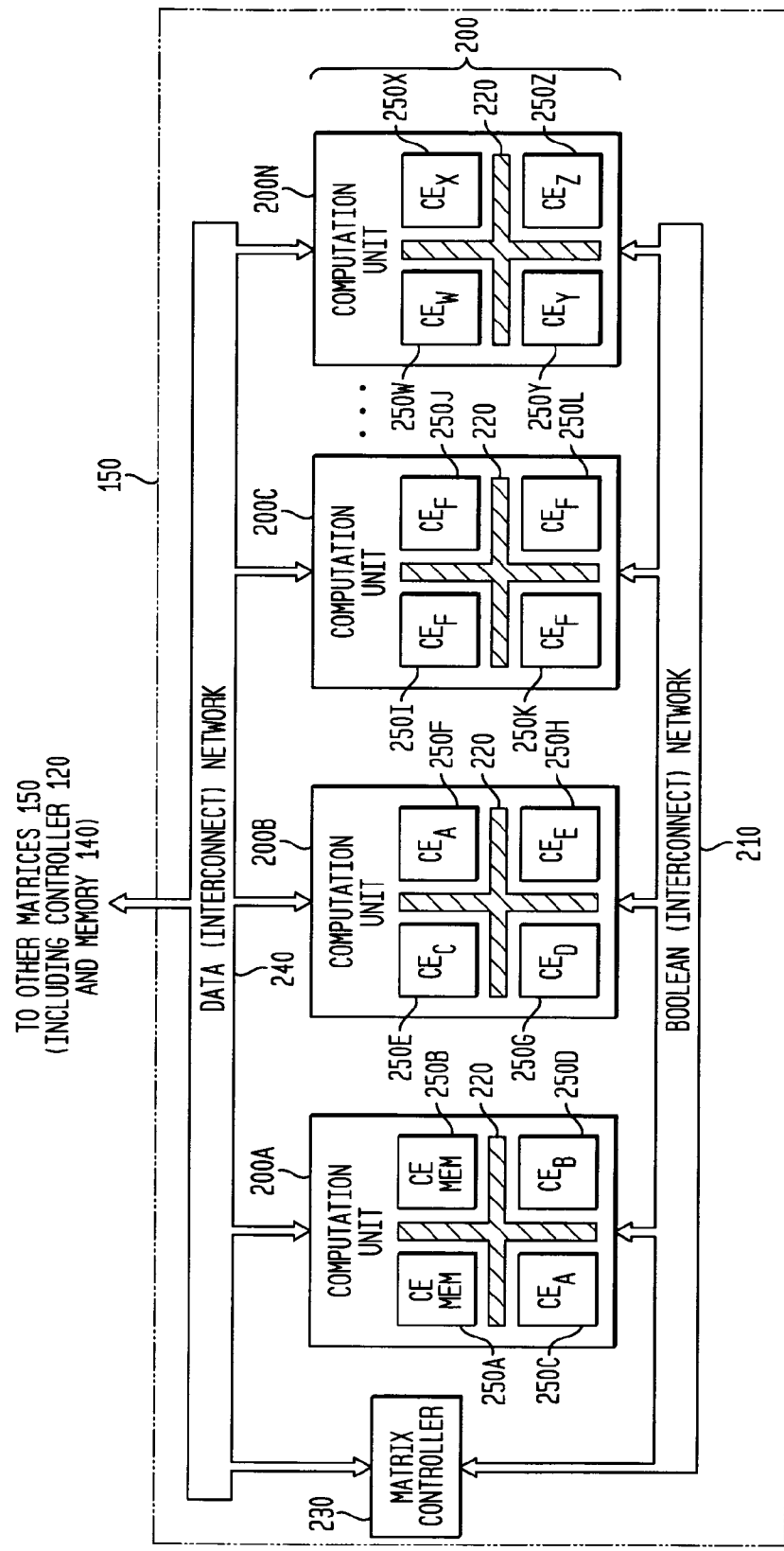
FIG. 3 is a block diagram illustrating a reconfigurable matrix (or node), a plurality of computation units, and a plurality of computational elements.
Figure 4:
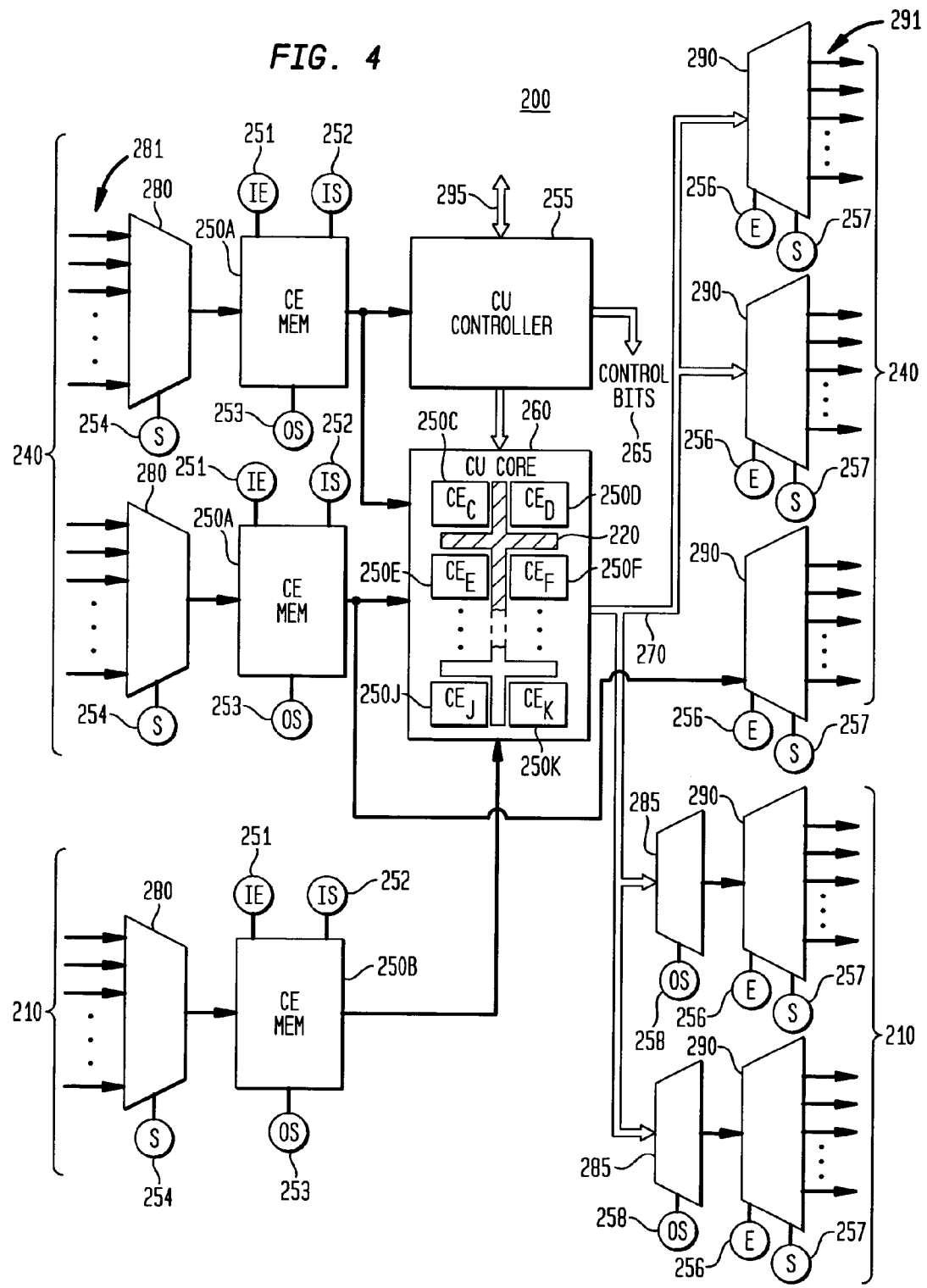
FIG. 4 is a block diagram illustrating, in greater detail, a computational unit of a reconfigurable matrix.

The matrix interconnection network ("MIN") 110 of FIG. 1, and its subset interconnection networks separately illustrated in FIGS. 3 and 4 (Boolean interconnection network 210, data interconnection network 240, and interconnect 220), collectively and generally referred to herein as "interconnect", "interconnection(s)" or "interconnection network(s)", may be implemented generally as known in the art, such as utilizing FPGA interconnection networks or switching fabrics, albeit in a considerably more varied fashion. In the first apparatus embodiment, the various interconnection networks are implemented as described, for example, in U.S. Pat. Nos. 5,218,240, 5,336,950, 5,245,227, and 5,144,166, and also as discussed below and as illustrated with reference to FIGS. 7, 8 and 9. These various interconnection networks provide selectable (or switchable) connections between and among the controller 120, the memory 140, the various matrices 150, and the computational units 200 and computational elements 250 discussed below, providing the physical basis for the configuration and reconfiguration referred to herein, in response to and under the control of configuration signaling generally referred to herein as "configuration information". In addition, the various interconnection networks (110, 210, 240 and 220) provide selectable or switchable data, input, output, control and configuration paths, between and among the controller 120, the memory 140, the various matrices 150, and the computational units 200 and computational elements 250, in lieu of any form of traditional or separate input/output busses, data busses, DMA, RAM, configuration and instruction busses. In the second apparatus embodiment, the various interconnection networks are implemented as described below with reference to FIGS. 12 and 13, using various combinations of routing elements, such as token rings or arbiters, and multiplexers, at varying levels within the system and apparatus embodiments.

It should be pointed out, however, that while any given level of switching or selecting operation of or within the various interconnection networks (110, 210, 240 and 220) may be implemented as known in the art, the combinations of routing elements and multiplexing elements, the use of different routing elements and multiplexing elements at differing levels within the system, and the design and layout of the various interconnection networks (110, 210, 240 and 220) are new and novel, as discussed in greater detail below. For example, varying levels of interconnection are provided to correspond to the varying levels of the matrices 150, the computational units 200, and the computational elements 250, discussed below. At the matrix 150 level, in comparison with the prior art FPGA interconnect, the matrix interconnection network 110 is considerably more limited and less "rich", with lesser connection capability in a given area, to reduce capacitance and increase speed of operation. Within a particular matrix 150 or computational unit 200, however, the interconnection network (210, 220 and 240) may be considerably more dense and rich, to provide greater adaptation and reconfiguration capability within a narrow or close locality of reference.

The various matrices or nodes 150 are reconfigurable and heterogeneous, namely, in general, and depending upon the desired configuration: reconfigurable matrix 150A is generally different from reconfigurable matrices 150B through 150N; reconfigurable matrix 150B is generally different from reconfigurable matrices 150A and 150C through 150N; reconfigurable matrix 150C is generally different from reconfigurable matrices 150A, 150B and 150D through 150N, and so on. The various reconfigurable matrices 150 each generally contain a different or varied mix of adaptive and reconfigurable computational (or computation) units (200); the computational units 200, in turn, generally contain a different or varied mix of fixed, application specific computational elements (250), discussed in greater detail below with reference to FIGS. 3 and 4, which may be adaptively connected, configured and reconfigured in various ways to perform varied functions, through the various interconnection networks. In addition to varied internal configurations and reconfigurations, the various matrices 150 may be connected, configured and reconfigured at a higher level, with respect to each of the other matrices 150, through the matrix interconnection network 110, also as discussed in greater detail below.

Several different, insightful and novel concepts are incorporated within the ACE 100 architecture and provide a useful explanatory basis for the real time operation of the ACE 100 and its inherent advantages.

The first novel concepts concern the adaptive and reconfigurable use of application specific, dedicated or fixed hardware units (computational elements 250), and the selection of particular functions for acceleration, to be included within these application specific, dedicated or fixed hardware units (computational elements 250) within the computational units 200 (FIG. 3) of the matrices 150, such as pluralities of multipliers, complex multipliers, and adders, each of which are designed for optimal execution of corresponding multiplication, complex multiplication, and addition functions. Given that the ACE 100 is to be optimized, in the first apparatus embodiment, for low power consumption, the functions for acceleration are selected based upon power consumption. For example, for a given application such as mobile communication, corresponding C (C# or C++) or other code may be analyzed for power consumption. Such empirical analysis may reveal, for example, that a small portion of such code, such as 10%, actually consumes 90% of the operating power when executed. On the basis of such power utilization, this small portion of code is selected for acceleration within certain types of the reconfigurable matrices 150, with the remaining code, for example, adapted to run within matrices 150 configured as controller 120. Additional code may also be selected for acceleration, resulting in an optimization of power consumption by the ACE 100, up to any potential trade-off resulting from design or operational complexity. In addition, as discussed with respect to FIG. 3, other functionality, such as control code, may be accelerated within matrices 150 when configured as finite state machines.

Figure 2:
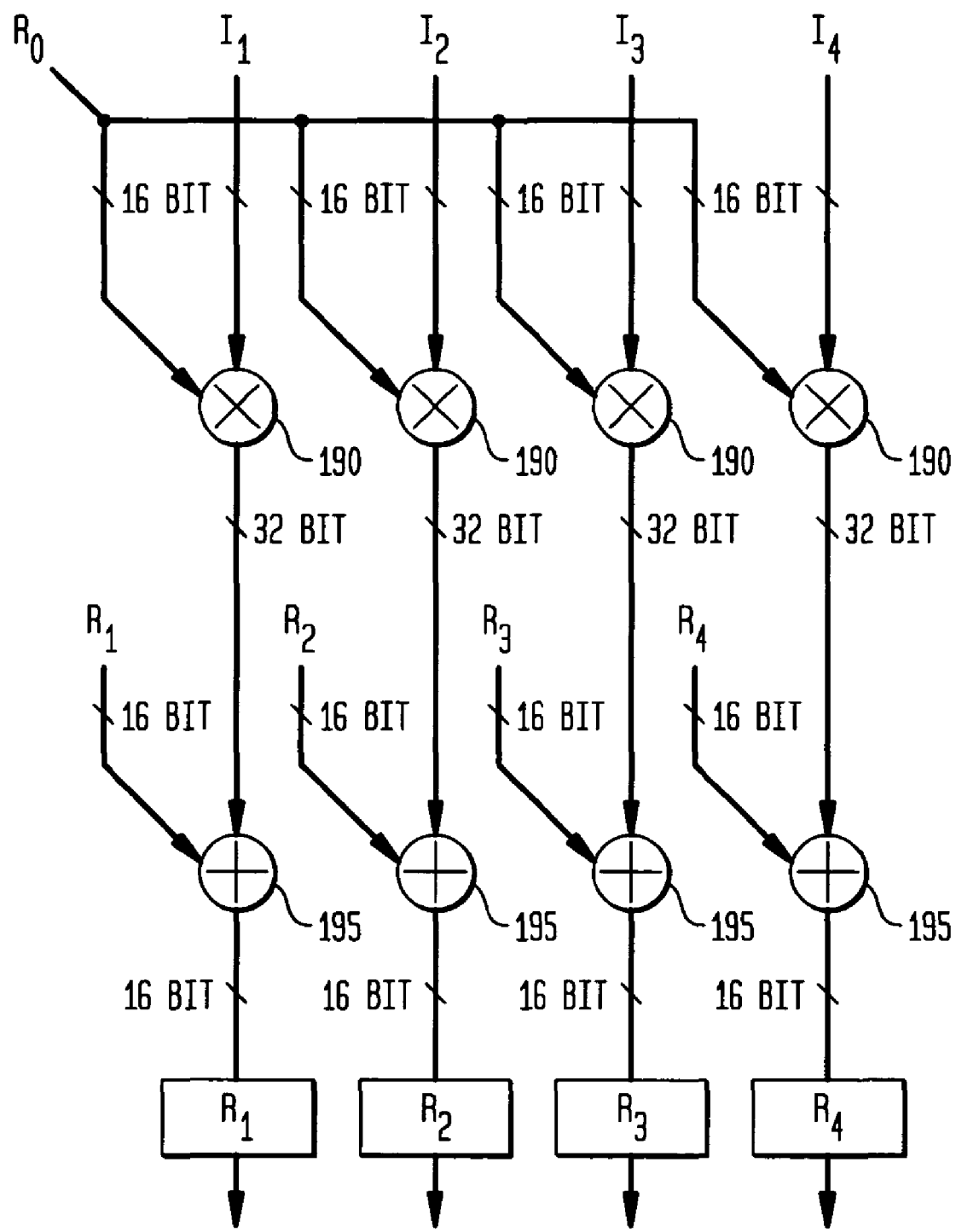
FIG. 2 is a schematic diagram illustrating an exemplary data flow graph.

Next, algorithms or other functions selected for acceleration are converted into a form referred to as a "data flow graph" ("DFG"). A schematic diagram of an exemplary data flow graph, in accordance with the present invention, is illustrated in FIG. 2. As illustrated in FIG. 2, an algorithm or function useful for CDMA voice coding (QCELP (Qualcomm code excited linear prediction) is implemented utilizing four multipliers 190 followed by four adders 195. Through the varying levels of interconnect, the algorithms of this data flow graph are then implemented, at any given time, through the configuration and reconfiguration of fixed computational elements (250), namely, implemented within hardware which has been optimized and configured for efficiency, i.e., a "machine" is configured in real time which is optimized to perform the particular algorithm. Continuing with the exemplary DFG or FIG. 2, four fixed or dedicated multipliers, as computational elements 250, and four fixed or dedicated adders, also as different computational elements 250, are configured in real time through the interconnect to perform the functions or algorithms of the particular DFG. Using this data flow model, data which is produced, such as by the multipliers 190, is immediately consumed, such as by adders 195.

The third and perhaps most significant concept, and a marked departure from the concepts and precepts of the prior art, is the concept of reconfigurable "heterogeneity" utilized to implement the various selected algorithms mentioned above. As indicated above, prior art reconfigurability has relied exclusively on homogeneous FPGAs, in which identical blocks of logic gates are repeated as an array within a rich, programmable interconnect, with the interconnect subsequently configured to provide connections between and among the identical gates to implement a particular function, albeit inefficiently and often with routing and combinatorial problems. In stark contrast, within computation units 200, different computational elements (250) are implemented directly as correspondingly different fixed (or dedicated) application specific hardware, such as dedicated multipliers, complex multipliers, accumulators, arithmetic logic units (ALUs), registers, and adders. Utilizing interconnect (210 and 220), these differing, heterogeneous computational elements (250) may then be adaptively configured, in real time, to perform the selected algorithm, such as the performance of discrete cosine transformations often utilized in mobile communications. For the data flow graph example of FIG. 2, four multipliers and four adders will be configured, i.e., connected in real time, to perform the particular algorithm. As a consequence, different ("heterogeneous") computational elements (250) are configured and reconfigured, at any given time, to optimally perform a given algorithm or other function. In addition, for repetitive functions, a given instantiation or configuration of computational elements may also remain in place over time, i.e., unchanged, throughout the course of such repetitive calculations.

The temporal nature of the ACE 100 architecture should also be noted. At any given instant of time, utilizing different levels of interconnect (110, 210, 240 and 220), a particular configuration may exist within the ACE 100 which has been optimized to perform a given function or implement a particular algorithm. At another instant in time, the configuration may be changed, to interconnect other computational elements (250) or connect the same computational elements 250 differently, for the performance of another function or algorithm. Two important features arise from this temporal reconfigurability. First, as algorithms may change over time to, for example, implement a new technology standard, the ACE 100 may co-evolve and be reconfigured to implement the new algorithm. For a simplified example, a fifth multiplier and a fifth adder may be incorporated into the DFG of FIG. 2 to execute a correspondingly new algorithm, with additional interconnect also potentially utilized to implement any additional bussing functionality. Second, because computational elements are interconnected at one instant in time, as an instantiation of a given algorithm, and then reconfigured at another instant in time for performance of another, different algorithm, gate (or transistor) utilization is maximized, providing significantly better performance than the most efficient ASICs relative to their activity factors.

This temporal reconfigurability of computational elements 250, for the performance of various different algorithms, also illustrates a conceptual distinction utilized herein between adaptation (configuration and reconfiguration), on the one hand, and programming or reprogrammability, on the other hand. Typical programmability utilizes a pre-existing group or set of functions, which may be called in various orders, over time, to implement a particular algorithm. In contrast, configurability and reconfigurability (or adaptation), as used herein, includes the additional capability of adding or creating new functions which were previously unavailable or nonexistent.

Next, the ACE 100 also utilizes a tight coupling (or interdigitation) of data and configuration (or other control) information, within one, effectively continuous stream of information. This coupling or commingling of data and configuration information, referred to as a "silverware" module, is the subject of a separate, related patent application. For purposes of the present invention, however, it is sufficient to note that this coupling of data and configuration information into one information (or bit) stream helps to enable real time reconfigurability of the ACE 100, without a need for the (often unused) multiple, overlaying networks of hardware interconnections of the prior art. For example, as an analogy, a particular, first configuration of computational elements at a particular, first period of time, as the hardware to execute a corresponding algorithm during or after that first period of time, may be viewed or conceptualized as a hardware analog of "calling" a subroutine in software which may perform the same algorithm. As a consequence, once the configuration of the computational elements 250 has occurred (i.e., is in place), as directed by the configuration information, the data for use in the algorithm is immediately available as part of the silverware module. The same computational elements may then be reconfigured for a second period of time, as directed by second configuration information, for execution of a second, different algorithm, also utilizing immediately available data. The immediacy of the data, for use in the configured computational elements 250, provides a one or two clock cycle hardware analog to the multiple and separate software steps of determining a memory address and fetching stored data from the addressed registers. This has the further result of additional efficiency, as the configured computational elements may execute, in comparatively few clock cycles, an algorithm which may require orders of magnitude more clock cycles for execution if called as a subroutine in a conventional microprocessor or DSP.

This use of silverware modules, as a commingling of data and configuration information, in conjunction with the real time reconfigurability of a plurality of heterogeneous and fixed computational elements 250 to form adaptive, different and heterogeneous computation units 200 and matrices 150, enables the ACE 100 architecture to have multiple and different modes of operation. For example, when included within a hand-held device, given a corresponding silverware module, the ACE 100 may have various and different operating modes as a cellular or other mobile telephone, a music player, a pager, a personal digital assistant, and other new or existing functionalities. In addition, these operating modes may change based upon the physical location of the device; for example, when configured as a CDMA mobile telephone for use in the United States, the ACE 100 may be reconfigured as a GSM mobile telephone for use in Europe.

Referring again to FIG. 1, the functions of the controller 120 (preferably matrix (KARC) 150A and matrix (MARC) 150B, configured as finite state machines) may be explained: (1) with reference to a silverware module, namely, the tight coupling of data and configuration information within a single stream of information; (2) with reference to multiple potential modes of operation; (3) with reference to the reconfigurable matrices 150; and (4) with reference to the reconfigurable computation units 200 and the computational elements 150 illustrated in FIG. 3. As indicated above, through a silverware module, the ACE 100 may be configured or reconfigured to perform a new or additional function, such as an upgrade to a new technology standard or the addition of an entirely new function, such as the addition of a music function to a mobile communication device. Such a silverware module may be stored in the matrices 150 of memory 140, or may be input from an external (wired or wireless) source through, for example, matrix interconnection network 110. In the first apparatus embodiment, one of the plurality of matrices 150 is configured to decrypt such a module and verify its validity, for security purposes. Next, prior to any configuration or reconfiguration of existing ACE 100 resources, the controller 120, through the matrix (KARC) 150A, checks and verifies that the configuration or reconfiguration may occur without adversely affecting any pre-existing functionality, such as whether the addition of music functionality would adversely affect pre-existing mobile communications functionality. In the first apparatus embodiment, the system requirements for such configuration or reconfiguration are included within the silverware module, for use by the matrix (KARC) 150A in performing this evaluative function. If the configuration or reconfiguration may occur without such adverse affects, the silverware module is allowed to load into the matrices 150 of memory 140, with the matrix (KARC) 150A setting up the DMA engines within the matrices 150C and 150D of the memory 140 (or other stand-alone DMA engines of a conventional memory). If the configuration or reconfiguration would or may have such adverse affects, the matrix (KARC) 150A does not allow the new module to be incorporated within the ACE 100. Additional functions of the kernel controller, as a K-node, are discussed in greater detail below.

Continuing to refer to FIG. 1, the matrix (MARC) 150B manages the scheduling of matrix 150 resources and the timing of any corresponding data, to synchronize any configuration or reconfiguration of the various computational elements 250 and computation units 200 with any corresponding input data and output data. In the first apparatus embodiment, timing information is also included within a silverware module, to allow the matrix (MARC) 150B through the various interconnection networks to direct a reconfiguration of the various matrices 150 in time, and preferably just in time, for the reconfiguration to occur before corresponding data has appeared at any inputs of the various reconfigured computation units 200. In addition, the matrix (MARC) 150B may also perform any residual processing which has not been accelerated within any of the various matrices 150. As a consequence, the matrix (MARC) 150B may be viewed as a control unit which "calls" the configurations and reconfigurations of the matrices 150, computation units 200 and computational elements 250, in real time, in synchronization with any corresponding data to be utilized by these various reconfigurable hardware units, and which performs any residual or other control processing. Other matrices 150 may also include this control functionality, with any given matrix 150 capable of calling and controlling a configuration and reconfiguration of other matrices 150. This matrix control functionality may also be combined with kernel control, such as in the K-node, discussed below.

FIG. 3 is a block diagram illustrating, in greater detail, a reconfigurable matrix (or node) 150 with a plurality of computation units 200 (illustrated as computation units 200A through 200N), and a plurality of computational elements 250 (illustrated as computational elements 250A through 250Z), and provides additional illustration of the exemplary types of computational elements 250 and a useful summary. As illustrated in FIG. 3, any matrix 150 generally includes a matrix controller 230, a plurality of computation (or computational) units 200, and as logical or conceptual subsets or portions of the matrix interconnect network 110, a data interconnect network 240 and a Boolean interconnect network 210. The matrix controller 230 may also be implemented as a hardware task manager, discussed below with reference to FIG. 10. As mentioned above, in the first apparatus embodiment, at increasing "depths" within the ACE 100 architecture, the interconnect networks become increasingly rich, for greater levels of adaptability and reconfiguration. The Boolean interconnect network 210, also as mentioned above, provides the reconfiguration and data interconnection capability between and among the various computation units 200, and is preferably small (i.e., only a few bits wide), while the data interconnect network 240 provides the reconfiguration and data interconnection capability for data input and output between and among the various computation units 200, and is preferably comparatively large (i.e., many bits wide). It should be noted, however, that while conceptually divided into reconfiguration and data capabilities, any given physical portion of the matrix interconnection network 110, at any given time, may be operating as either the Boolean interconnect network 210, the data interconnect network 240, the lowest level interconnect 220 (between and among the various computational elements 250), or other input, output, or connection functionality. It should also be noted that other, exemplary forms of interconnect are discussed in greater detail below with reference to FIGS. 11-13.

Continuing to refer to FIG. 3, included within a computation unit 200 are a plurality of computational elements 250, illustrated as computational elements 250A through 250Z (individually and collectively referred to as computational elements 250), and additional interconnect 220. The interconnect 220 provides the reconfigurable interconnection capability and input/output paths between and among the various computational elements 250. As indicated above, each of the various computational elements 250 consist of dedicated, application specific hardware designed to perform a given task or range of tasks, resulting in a plurality of different, fixed computational elements 250. Utilizing the interconnect 220, the fixed computational elements 250 may be reconfigurably connected together into adaptive and varied computational units 200, which also may be further reconfigured and interconnected, to execute an algorithm or other function, at any given time, such as the quadruple multiplications and additions of the DFG of FIG. 2, utilizing the interconnect 220, the Boolean network 210, and the matrix interconnection network 110. For example, using the multiplexing or routing capabilities discussed below, the inputs/outputs of a computational element 250 may be coupled to outputs/inputs of a first set of (other) computational elements 250, for performance of a first function or algorithm, and subsequently adapted or reconfigured, such that these inputs/outputs are coupled to outputs/inputs of a second set of (other) computational elements 250, for performance of a second function or algorithm.

In the first apparatus embodiment, the various computational elements 250 are designed and grouped together, into the various adaptive and reconfigurable computation units 200 (as illustrated, for example, in FIGS. 5A through 9). In addition to computational elements 250 which are designed to execute a particular algorithm or function, such as multiplication or addition, other types of computational elements 250 are also utilized in the first apparatus embodiment. As illustrated in FIG. 3, computational elements 250A and 250B implement memory, to provide local memory elements for any given calculation or processing function (compared to the more "remote" memory 140). In addition, computational elements 250I, 250J, 250K and 250L are configured to implement finite state machines (using, for example, the computational elements illustrated in FIGS. 7, 8 and 9), to provide local processing capability (compared to the more "remote" matrix (MARC) 150B), especially suitable for complicated control processing, and which may be utilized within the hardware task manager, discussed below.

With the various types of different computational elements 250 which may be available, depending upon the desired functionality of the ACE 100, the computation units 200 may be loosely categorized. A first category of computation units 200 includes computational elements 250 performing linear operations, such as multiplication, addition, finite impulse response filtering, and so on (as illustrated below, for example, with reference to FIGS. 5A through 5E and FIG. 6). A second category of computation units 200 includes computational elements 250 performing non-linear operations, such as discrete cosine transformation, trigonometric calculations, and complex multiplications. A third type of computation unit 200 implements a finite state machine, such as computation unit 200C as illustrated in FIG. 3 and as illustrated in greater detail below with respect to FIGS. 7 through 9), particularly useful for complicated control sequences, dynamic scheduling, and input/output management, while a fourth type may implement memory and memory management, such as computation unit 200A as illustrated in FIG. 3. Lastly, a fifth type of computation unit 200 may be included to perform bit-level manipulation, such as for encryption, decryption, channel coding, Viterbi decoding, and packet and protocol processing (such as Internet Protocol processing).

In the first apparatus embodiment, in addition to control from other matrices or nodes 150, a matrix controller 230 may also be included within any given matrix 150, also to provide greater locality of reference and control of any reconfiguration processes and any corresponding data manipulations. For example, once a reconfiguration of computational elements 250 has occurred within any given computation unit 200, the matrix controller 230 may direct that that particular instantiation (or configuration) remain intact for a certain period of time to, for example, continue repetitive data processing for a given application.

As indicated above, the plurality of heterogeneous computational elements 250 may be configured and reconfigured, through the levels of the interconnect network (110, 210, 220, 240), for performance of a plurality of functional or operational modes, such as linear operations, non-linear operations, finite state machine operations, memory and memory management, and bit-level manipulation. This configuration and reconfiguration of the plurality of heterogeneous computational elements 250 through the levels of the interconnect network (110, 210, 220, 240), however, may be conceptualized on another, higher or more abstract level, namely, configuration and reconfiguration for the performance of a plurality of algorithmic elements.

At this more abstract level of the algorithmic element, the performance of any one of the algorithmic elements may be considered to require a simultaneous performance of a plurality of the lower-level functions or operations, such as move, input, output, add, subtract, multiply, complex multiply, divide, shift, multiply and accumulate, and so on, using a configuration (and reconfiguration) of computational elements having a plurality of fixed architectures such as memory, addition, multiplication, complex multiplication, subtraction, synchronization, queuing, over sampling, under sampling, adaptation, configuration, reconfiguration, control, input, output, and field programmability.

When such a plurality of fixed architectures are configured and reconfigured for performance of an entire algorithmic element, this performance may occur using comparatively few clock cycles, compared to the orders of magnitude more clock cycles typically required. The algorithmic elements may be selected from a plurality of algorithmic elements comprising, for example: a radix-2 Fast Fourier Transformation (FFT), a radix-4 Fast Fourier Transformation (FFT), a radix-2 inverse Fast Fourier Transformation (IFFT), a radix-4 IFFT, a one-dimensional Discrete Cosine Transformation (DCT), a multi-dimensional Discrete Cosine Transformation (DCT), finite impulse response (FIR) filtering, convolutional encoding, scrambling, puncturing, interleaving, modulation mapping, Golay correlation, OVSF code generation, Haddamard Transformation, Turbo Decoding, bit correlation, Griffiths LMS algorithm, variable length encoding, uplink scrambling code generation, downlink scrambling code generation, downlink despreading, uplink spreading, uplink concatenation, Viterbi encoding, Viterbi decoding, cyclic redundancy coding (CRC), complex multiplication, data compression, motion compensation, channel searching, channel acquisition, and multipath correlation. Numerous other algorithmic element examples are discussed in greater detail below with reference to FIG. 10.

In another embodiment of the ACE 100, one or more of the matrices (or nodes) 150 may be designed to be application specific, having a fixed architecture with a corresponding fixed function (or predetermined application), rather than being comprised of a plurality of heterogeneous computational elements which may be configured and reconfigured for performance of a plurality of operations, functions, or algorithmic elements. For example, an analog-to-digital (A/D) or digital-to-analog (D/A) converter may be implemented without adaptive capability. As discussed in greater detail below, common node (matrix) functions also may be implemented without adaptive capability, such as the node wrapper functions discussed below. Under various circumstances, however, the fixed function node may be capable of parameter adjustment for performance of the predetermined application. For example, the parameter adjustment may comprise changing one or more of the following parameters: a number of filter coefficients, a number of parallel input bits, a number of parallel output bits, a number of selected points for Fast Fourier Transformation, a number of bits of precision, a code rate, a number of bits of interpolation of a trigonometric function, and real or complex number valuation. This fixed function node (or matrix) 150, which may be parametizable, will typically be utilized in circumstances where an algorithmic element is used on a virtually continuous basis, such as in certain types of communications or computing applications.

For example, the fixed function node 150 may be a microprocessor (such as a RISC processor), a digital signal processor (DSP), or a co-processor, and may or may not have an embedded operating system. Such a controller or processor fixed function node 150 may be utilized for the various KARC 150A or MARC 150B applications mentioned above, such as providing configuration information to the interconnection network, directing and scheduling the configuration of the plurality of heterogeneous computational elements 250 of the other nodes 150 for performance of the various functional modes or algorithmic elements, or timing and scheduling the configuration and reconfiguration of the plurality of heterogeneous computational elements with corresponding data. In other applications, also for example, the fixed function node may be a cascaded integrated comb (CIC) filter or a parameterized, cascaded integrated comb (CIC) filter; a finite impulse response (FIR) filter or a finite impulse response (FIR) filter parameterized for variable filter length; or an A/D or D/A converter.

FIG. 4 is a block diagram illustrating, in greater detail, an exemplary or representative computation unit 200 of a reconfigurable matrix 150. As illustrated in FIG. 4, a computation unit 200 typically includes a plurality of diverse, heterogeneous and fixed computational elements 250, such as a plurality of memory computational elements 250A and 250B, and forming a computational unit ("CU") core 260, a plurality of algorithmic or finite state machine computational elements 250C through 250K. As discussed above, each computational element 250, of the plurality of diverse computational elements 250, is a fixed or dedicated, application specific circuit, designed and having a corresponding logic gate layout to perform a specific function or algorithm, such as addition or multiplication. In addition, the various memory computational elements 250A and 250B may be implemented with various bit depths, such as RAM (having significant depth), or as a register, having a depth of 1 or 2 bits.

Forming the conceptual data and Boolean interconnect networks 240 and 210, respectively, the exemplary computation unit 200 also includes a plurality of input multiplexers 280, a plurality of input lines (or wires) 281, and for the output of the CU core 260 (illustrated as line or wire 270), a plurality of output demultiplexers 285 and 290, and a plurality of output lines (or wires) 291. Through the input multiplexers 280, an appropriate input line 281 may be selected for input use in data transformation and in the configuration and interconnection processes, and through the output demultiplexers 285 and 290, an output or multiple outputs may be placed on a selected output line 291, also for use in additional data transformation and in the configuration and interconnection processes.

In the first apparatus embodiment, the selection of various input and output lines 281 and 291, and the creation of various connections through the interconnect (210, 220 and 240), is under control of control bits 265 from a computational unit controller 255, as discussed below. Based upon these control bits 265, any of the various input enables 251, input selects 252, output selects 253, MUX selects 254, DEMUX enables 256, DEMUX selects 257, and DEMUX output selects 258, may be activated or deactivated.

The exemplary computation unit 200 includes the computation unit controller 255 which provides control, through control bits 265, over what each computational element 250, interconnect (210, 220 and 240), and other elements (above) does with every clock cycle. Not separately illustrated, through the interconnect (210, 220 and 240), the various control bits 265 are distributed, as may be needed, to the various portions of the computation unit 200, such as the various input enables 251, input selects 252, output selects 253, MUX selects 254, DEMUX enables 256, DEMUX selects 257, and DEMUX output selects 258. The CU controller 255 also includes one or more lines 295 for reception of control (or configuration) information and transmission of status information.

As mentioned above, the interconnect may include a conceptual division into a data interconnect network 240 and a Boolean interconnect network 210, of varying bit widths, as mentioned above. In general, the (wider) data interconnection network 240 is utilized for creating configurable and reconfigurable connections, for corresponding routing of data and configuration information. The (narrower) Boolean interconnect network 210, while also utilized for creating configurable and reconfigurable connections, is utilized for control of logic (or Boolean) decisions of the various data flow graphs, generating decision nodes in such DFGs, and may also be used for data routing within such DFGs.

FIGS. 5A through 5E are block diagrams illustrating, in detail, exemplary fixed and specific computational elements, forming computational units. As will be apparent from review of these Figures, many of the same fixed computational elements are utilized, with varying configurations, for the performance of different algorithms.

Figure 5A:
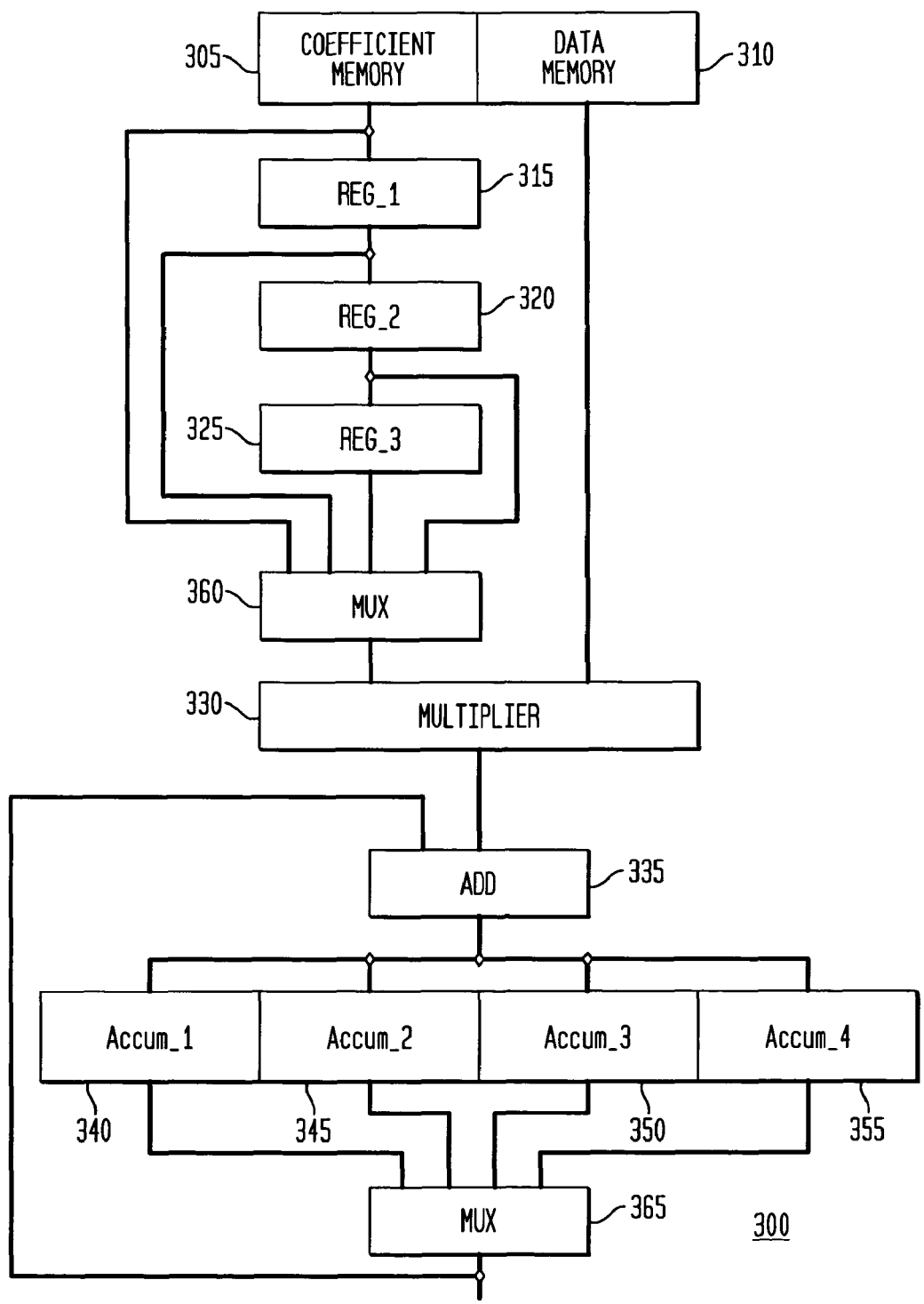
FIGS. 5A through 5E are block diagrams illustrating, in detail, exemplary fixed and specific computational elements, forming computational units.

FIG. 5A is a block diagram illustrating a four-point asymetric finite impulse response (FIR) filter computational unit 300. As illustrated, this exemplary computational unit 300 includes a particular, first configuration of a plurality of fixed computational elements, including coefficient memory 305, data memory 310, registers 315, 320 and 325, multiplier 330, adder 335, and accumulator registers 340, 345, 350 and 355, with multiplexers (MUXes) 360 and 365 forming a portion of the interconnection network (210, 220 and 240).

Figure 5B:
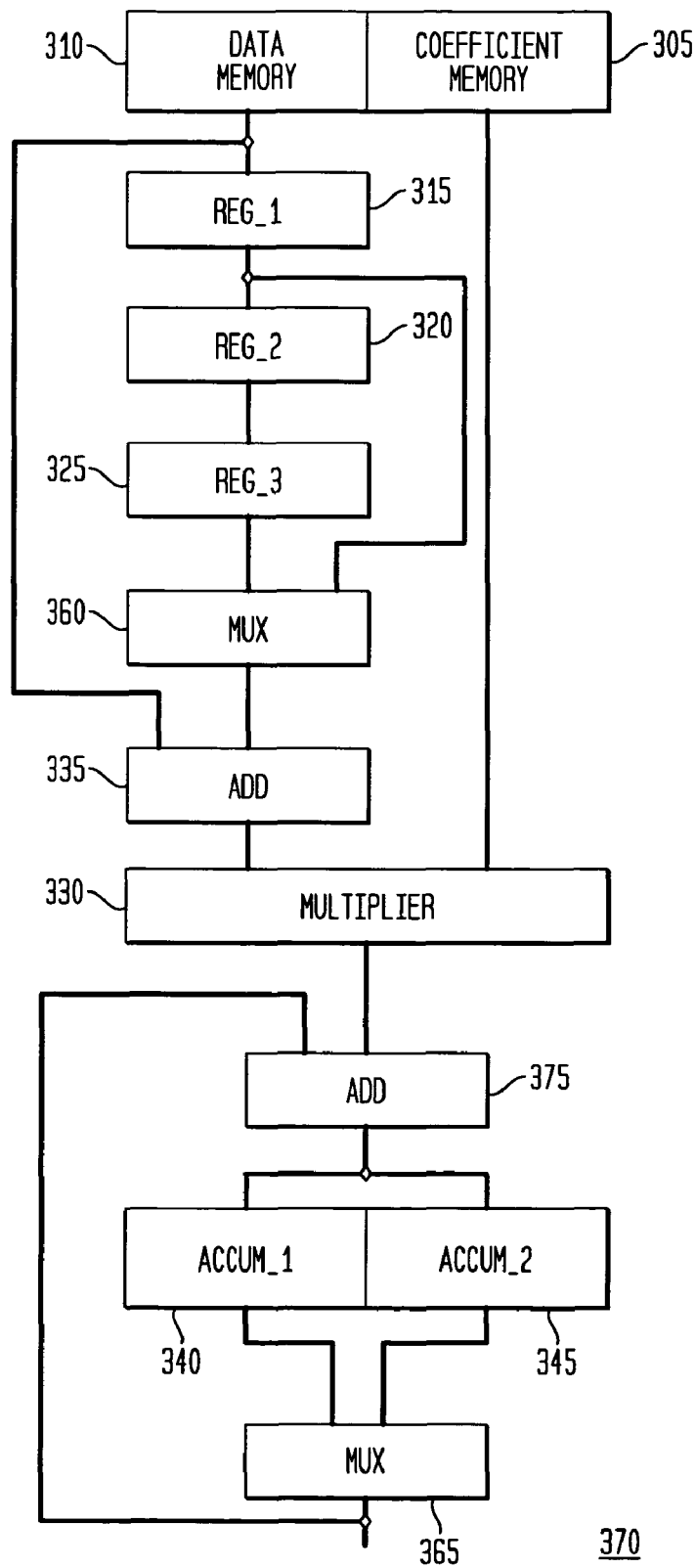

FIG. 5B is a block diagram illustrating a two-point symmetric finite impulse response (FIR) filter computational unit 370. As illustrated, this exemplary computational unit 370 includes a second configuration of a plurality of fixed computational elements, including coefficient memory 305, data memory 310, registers 315, 320 and 325, multiplier 330, adder 335, second adder 375, and accumulator registers 340 and 345, also with multiplexers (MUXes) 360 and 365 forming a portion of the interconnection network (210, 220 and 240).

Figure 5C:
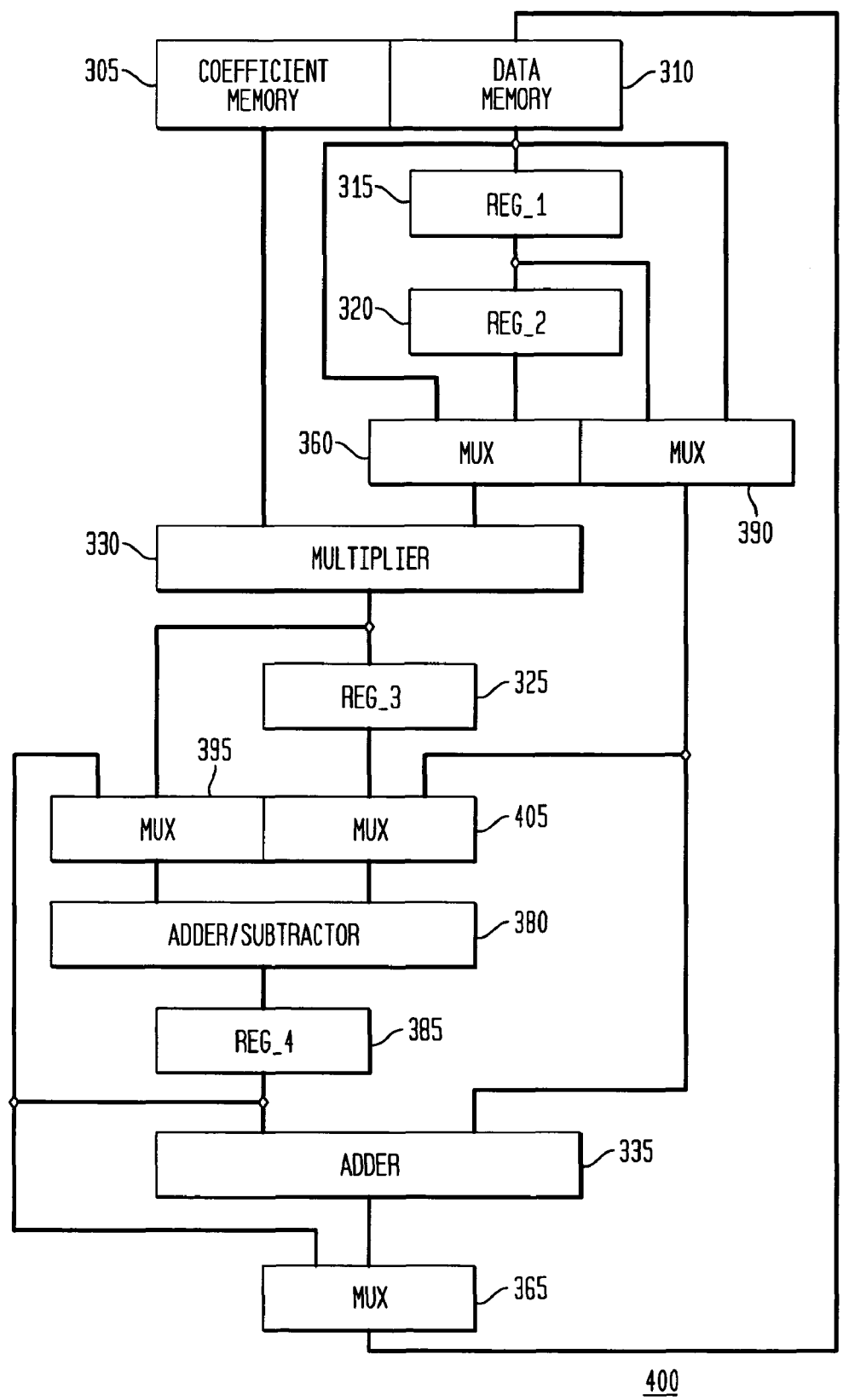

FIG. 5C is a block diagram illustrating a subunit for a fast Fourier transform (FFT) computational unit 400. As illustrated, this exemplary computational unit 400 includes a third configuration of a plurality of fixed computational elements, including coefficient memory 305, data memory 310, registers 315, 320, 325 and 385, multiplier 330, adder 335, and adder/subtracter 380, with multiplexers (MUXes) 360, 365, 390, 395 and 405 forming a portion of the interconnection network (210, 220 and 240).

Figure 5D:
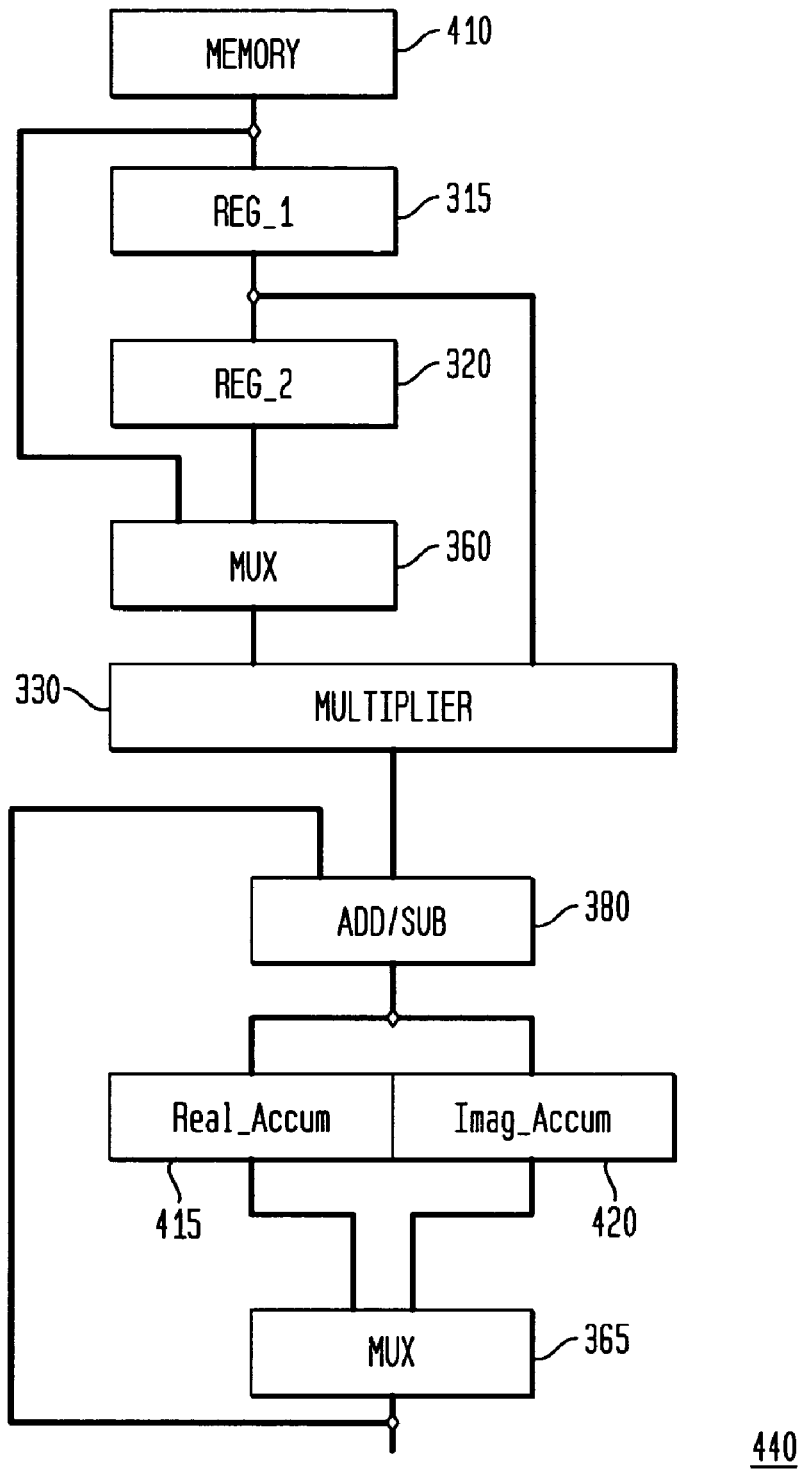

FIG. 5D is a block diagram illustrating a complex finite impulse response (FIR) filter computational unit 440. As illustrated, this exemplary computational unit 440 includes a fourth configuration of a plurality of fixed computational elements, including memory 410, registers 315 and 320, multiplier 330, adder/subtracter 380, and real and imaginary accumulator registers 415 and 420, also with multiplexers (MUXes) 360 and 365 forming a portion of the interconnection network (210, 220 and 240).

Figure 5E:
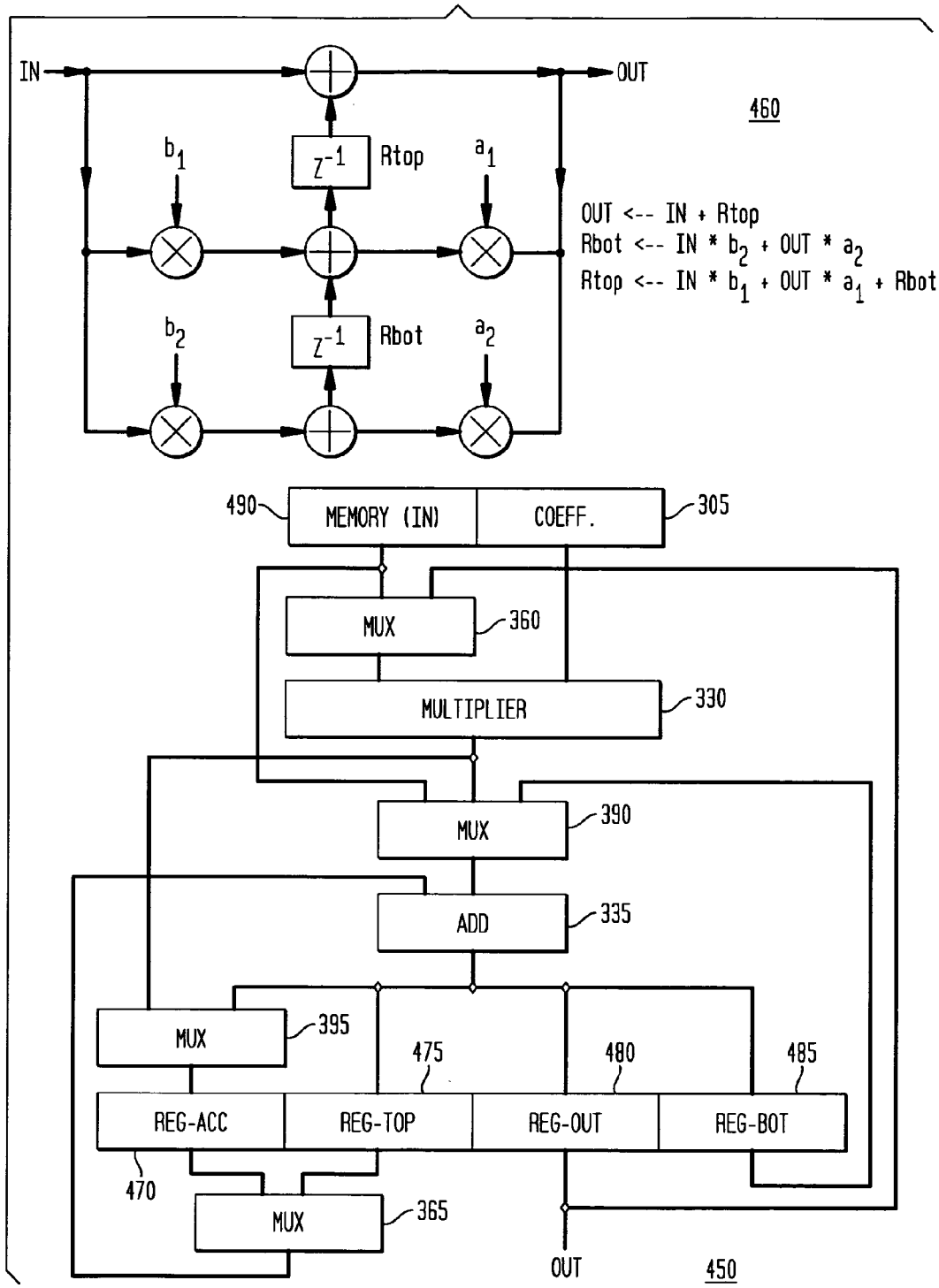

FIG. 5E is a block diagram illustrating a biquad infinite impulse response (IIR) filter computational unit 450, with a corresponding data flow graph 460. As illustrated, this exemplary computational unit 450 includes a fifth configuration of a plurality of fixed computational elements, including coefficient memory 305, input memory 490, registers 470, 475, 480 and 485, multiplier 330, and adder 335, with multiplexers (MUXes) 360, 365, 390 and 395 forming a portion of the interconnection network (210, 220 and 240).

Figures 6, 6A:
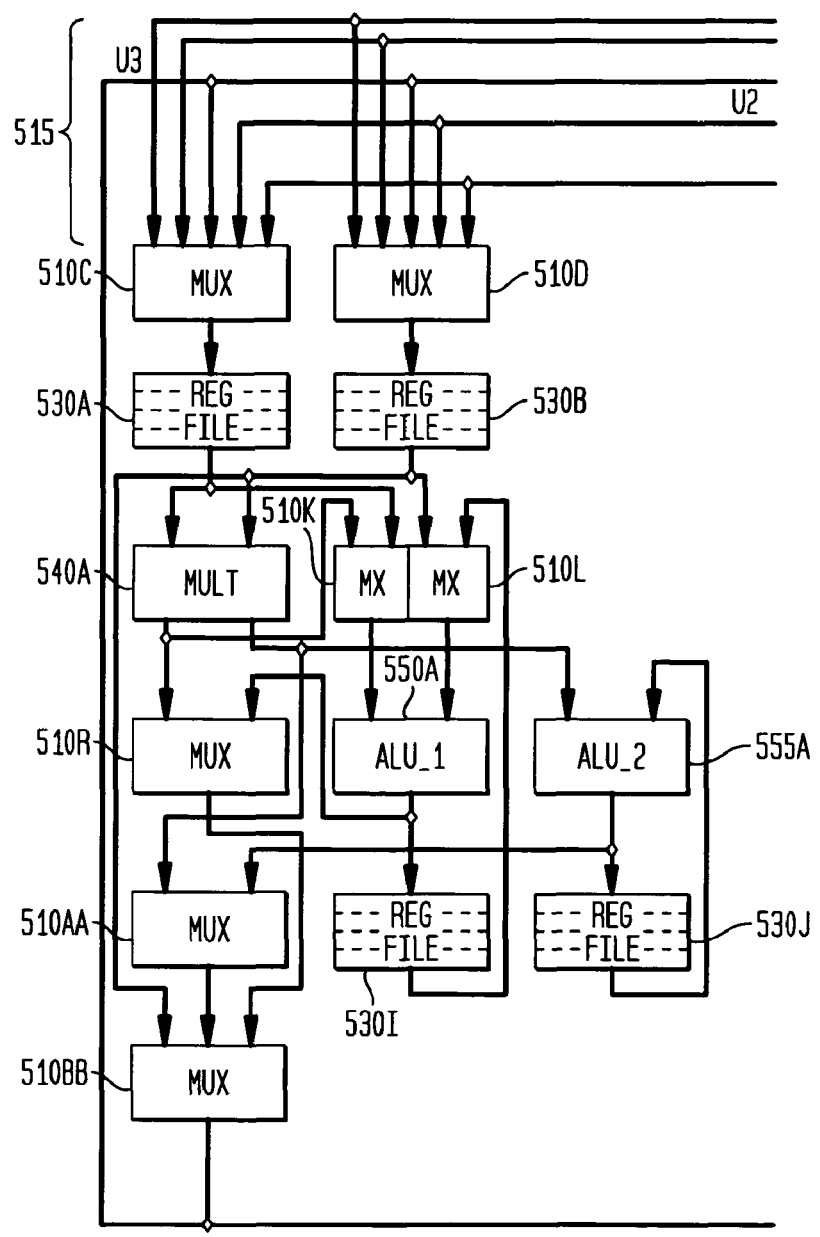
FIG. 6 is a block diagram illustrating, in detail, an exemplary multi-function adaptive computational unit having a plurality of different, fixed computational elements.
Figure 6B:
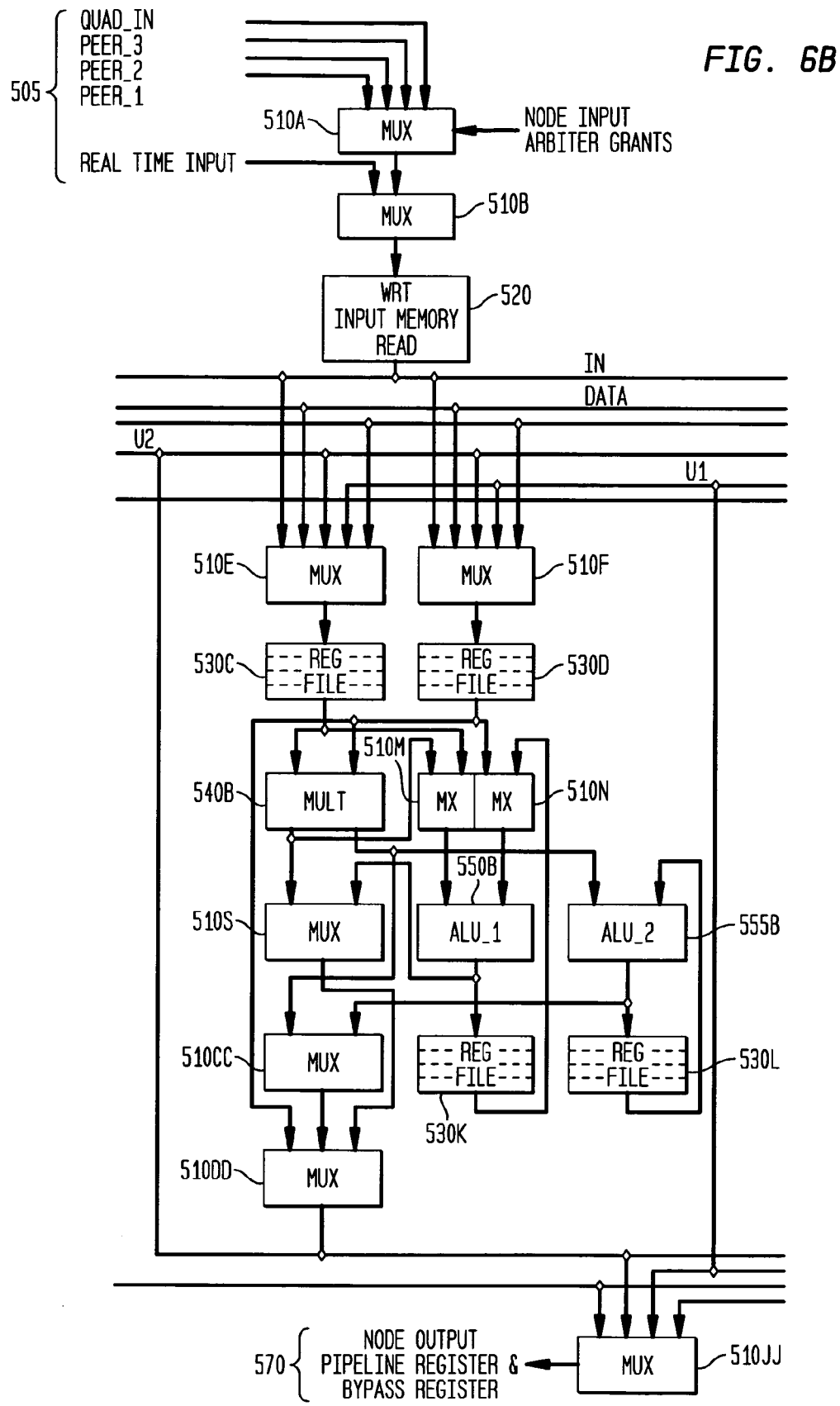
Figure 6C:
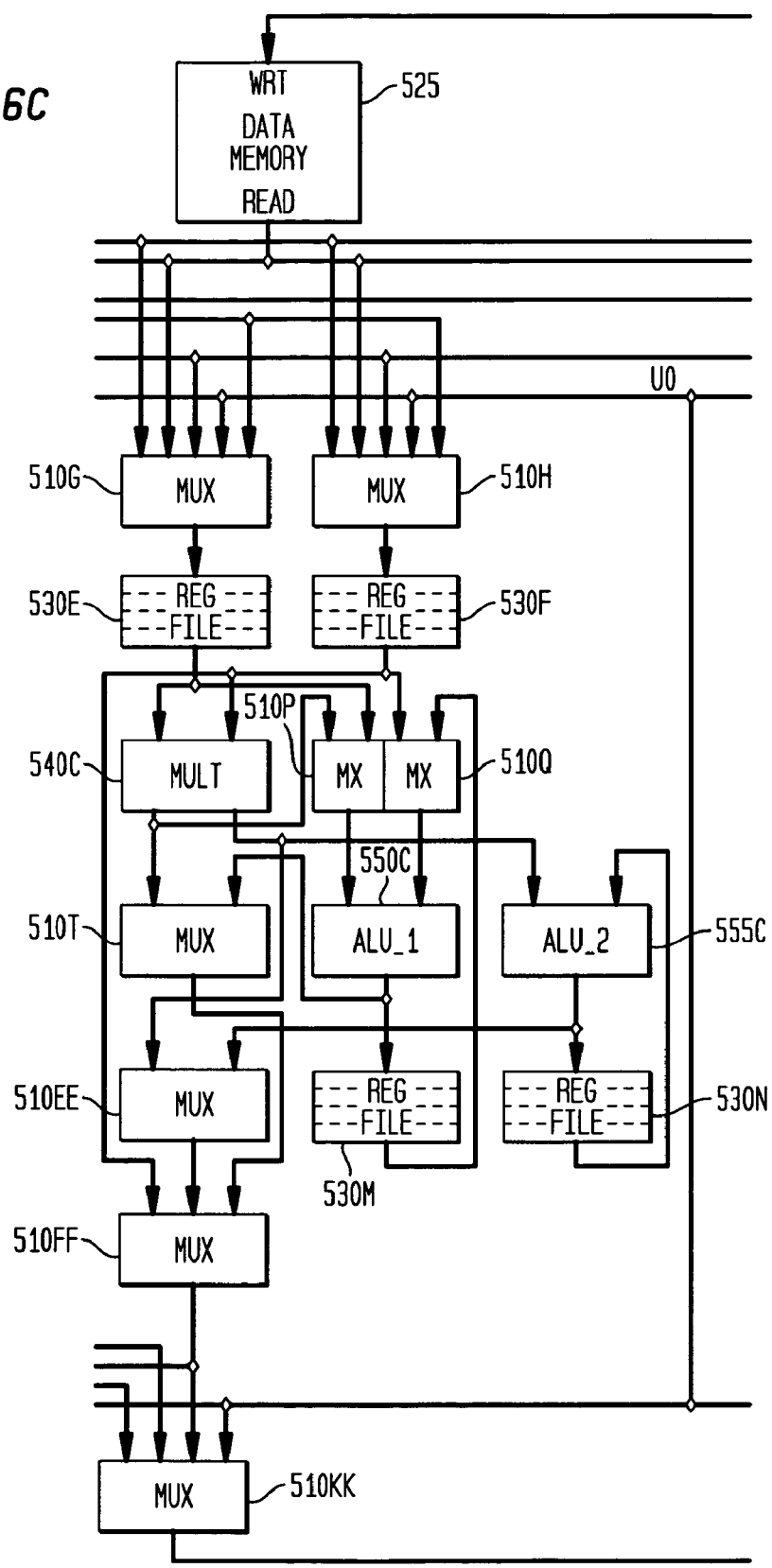
Figure 6D:
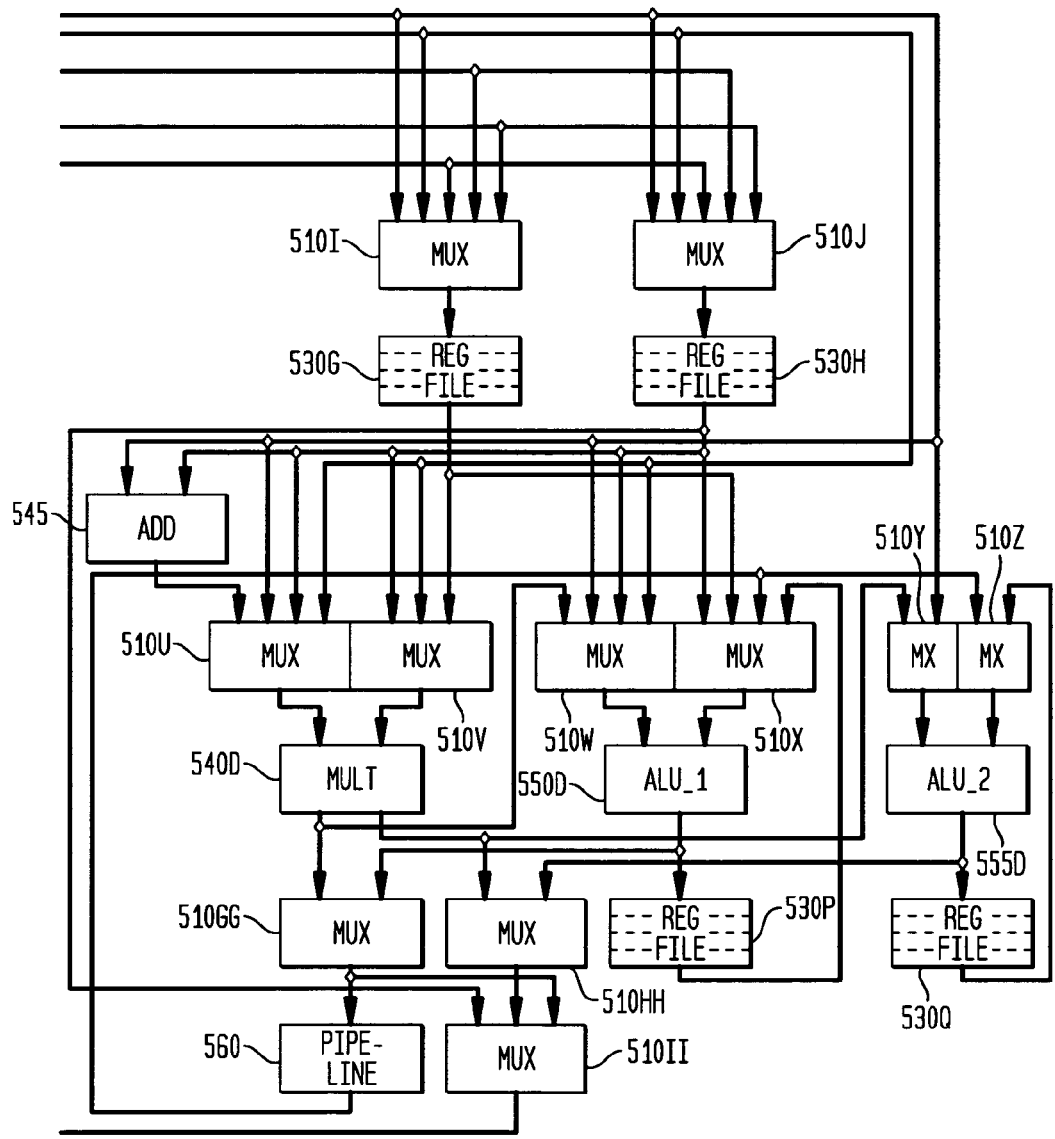

FIG. 6 is a block diagram illustrating, in detail, an exemplary multi-function adaptive computational unit 500 having a plurality of different, fixed computational elements. When configured accordingly, the adaptive computation unit 500 performs each of the various functions previously illustrated with reference to FIGS. 5A though 5E, plus other functions such as discrete cosine transformation. As illustrated, this multi-function adaptive computational unit 500 includes capability for a plurality of configurations of a plurality of fixed computational elements, including input memory 520, data memory 525, registers 530 (illustrated as registers 530A through 530Q), multipliers 540 (illustrated as multipliers 540A through 540D), adder 545, first arithmetic logic unit (ALU) 550 (illustrated as ALU_1s 550A through 550D), second arithmetic logic unit (ALU) 555 (illustrated as ALU_2s 555A through 555D), and pipeline (length 1) register 560, with inputs 505, lines 515, outputs 570, and multiplexers (MUXes or MXes) 510 (illustrates as MUXes and MXes 510A through 510KK) forming an interconnection network (210, 220 and 240). The two different ALUs 550 and 555 are preferably utilized, for example, for parallel addition and subtraction operations, particularly useful for radix 2 operations in discrete cosine transformation.

Figure 7:
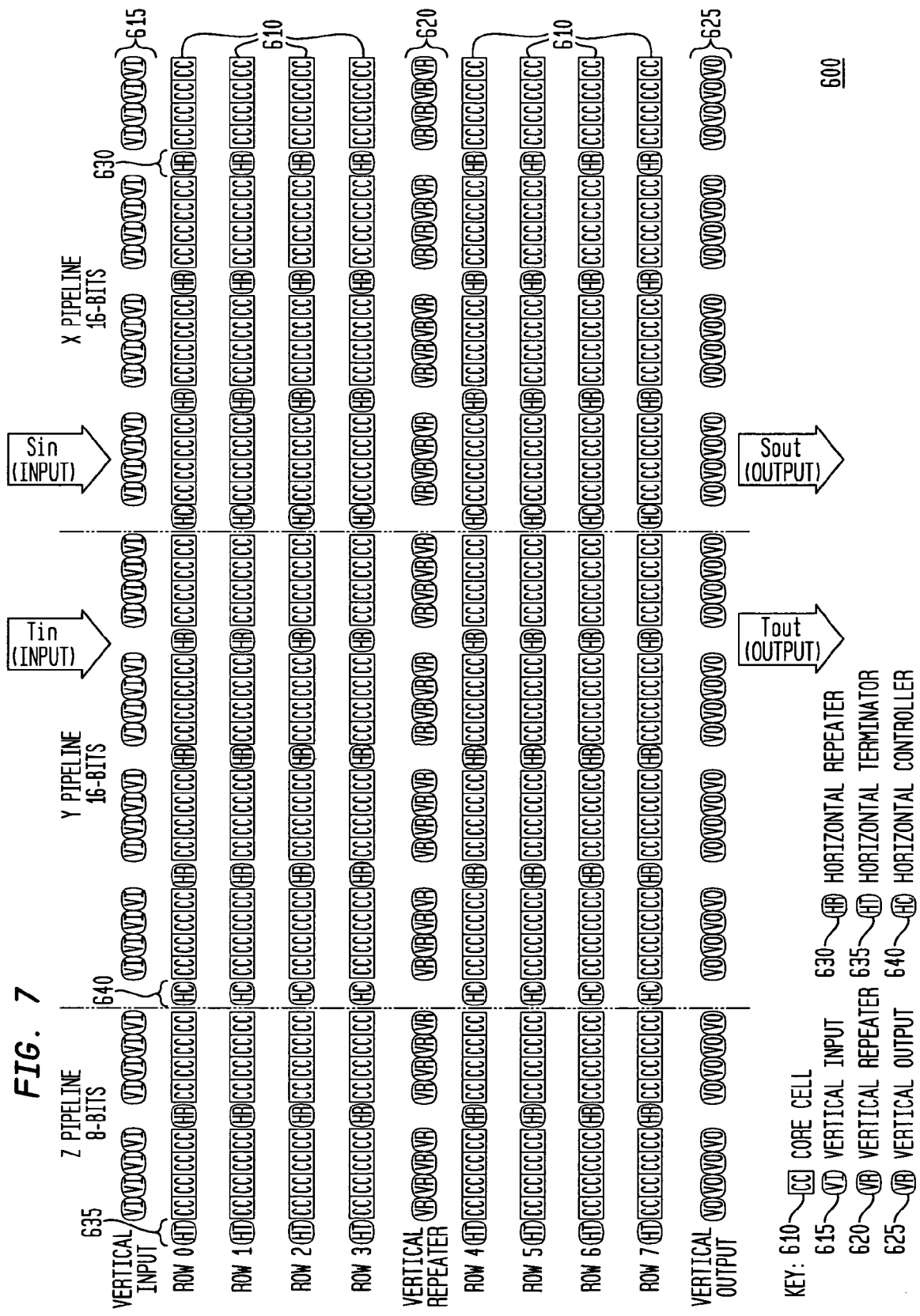
FIG. 7 is a block diagram illustrating, in detail, an adaptive logic processor computational unit having a plurality of fixed computational elements.

FIG. 7 is a block diagram illustrating, in detail, an exemplary adaptive logic processor (ALP) computational unit 600 having a plurality of fixed computational elements. The ALP 600 is highly adaptable, and is preferably utilized for input/output configuration, finite state machine implementation, general field programmability, and bit manipulation. The fixed computational element of ALP 600 is a portion (650) of each of the plurality of adaptive core cells (CCs) 610 (FIG. 8), as separately illustrated in FIG. 9. An interconnection network (210, 220 and 240) is formed from various combinations and permutations of the pluralities of vertical inputs (VIs) 615, vertical repeaters (VRs) 620, vertical outputs (VOs) 625, horizontal repeaters (HRs) 630, horizontal terminators (HTs) 635, and horizontal controllers (HCs) 640.

Figure 8:
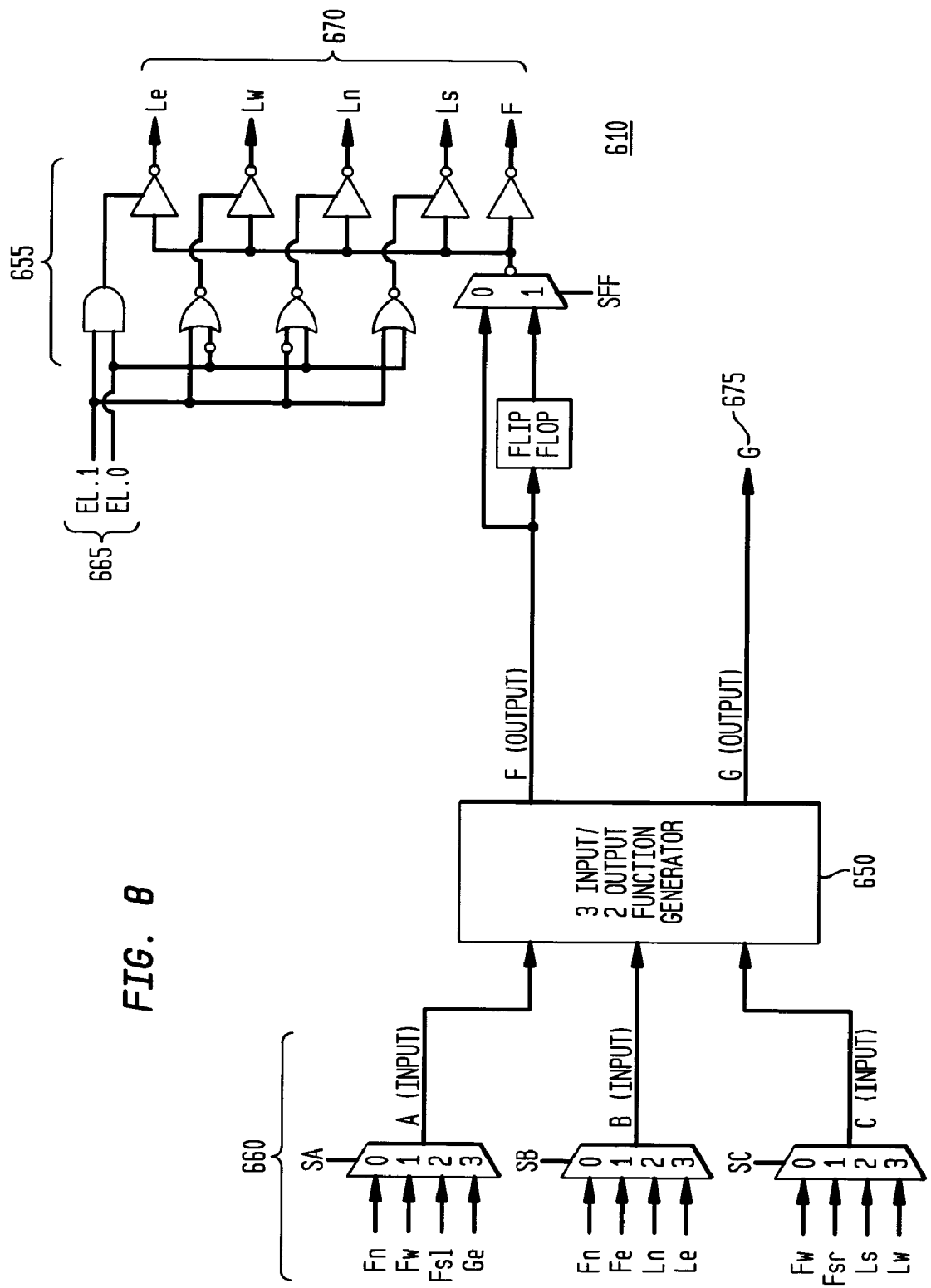
FIG. 8 is a block diagram illustrating, in greater detail, an exemplary core cell of an adaptive logic processor computational unit with a fixed computational element.

FIG. 8 is a block diagram illustrating, in greater detail, an exemplary core cell 610 of an adaptive logic processor computational unit 600 with a fixed computational element 650. The fixed computational element is a 3 input-2 output function generator 550, separately illustrated in FIG. 9. The preferred core cell 610 also includes control logic 655, control inputs 665, control outputs 670 (providing output interconnect), output 675, and inputs (with interconnect muxes) 660 (providing input interconnect).

Figure 9:
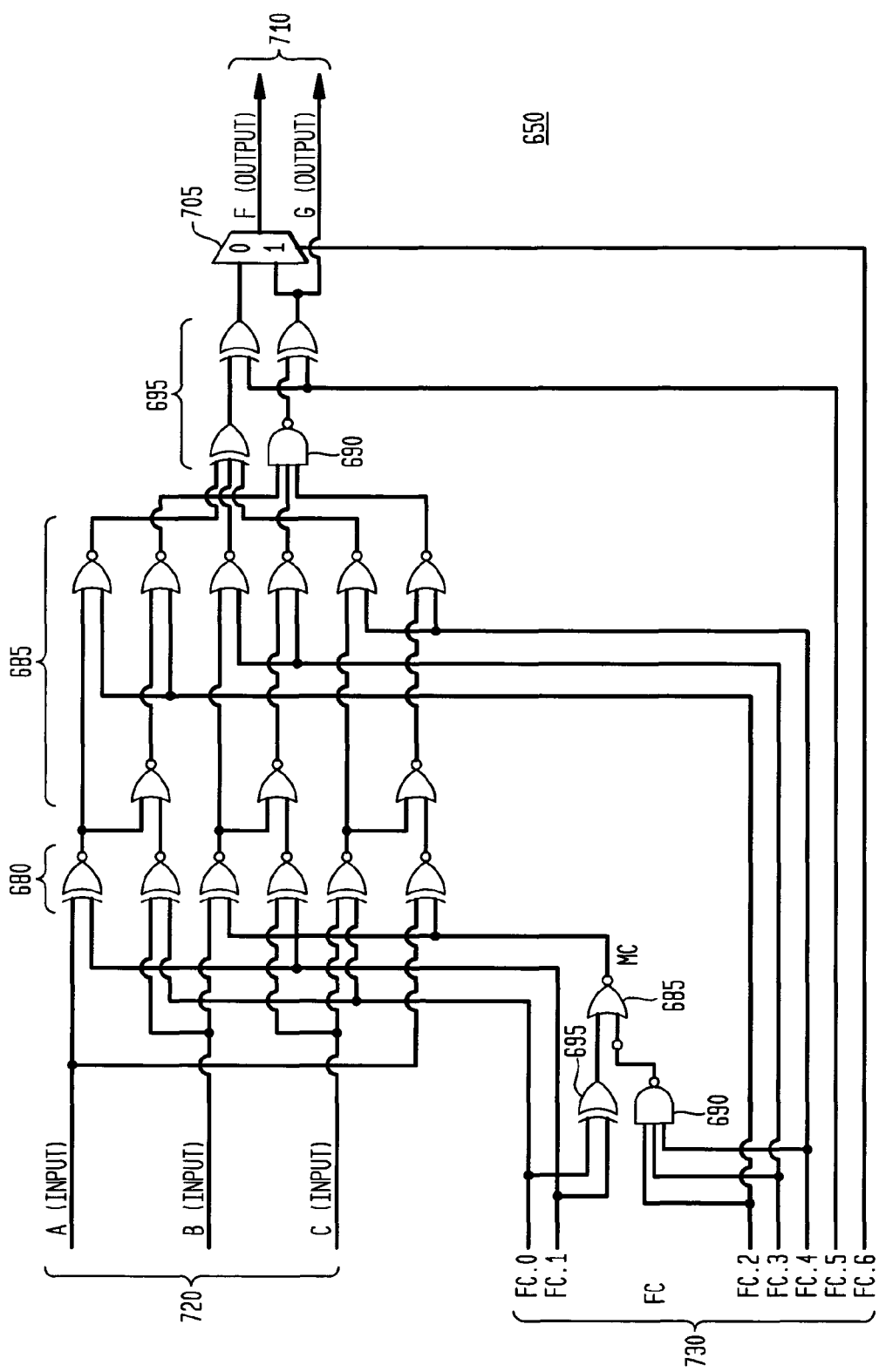
FIG. 9 is a block diagram illustrating, in greater detail, an exemplary fixed computational element of a core cell of an adaptive logic processor computational unit.

FIG. 9 is a block diagram illustrating, in greater detail, an exemplary fixed computational element 650 of a core cell 610 of an adaptive logic processor computational unit 600. The fixed computational element 650 is comprised of a fixed layout of pluralities of exclusive NOR (XNOR) gates 680, NOR gates 685, NAND gates 690, and exclusive OR (XOR) gates 695, with three inputs 720 and two outputs 710. Configuration and interconnection is provided through MUX 705 and interconnect inputs 730.

Figure 10:
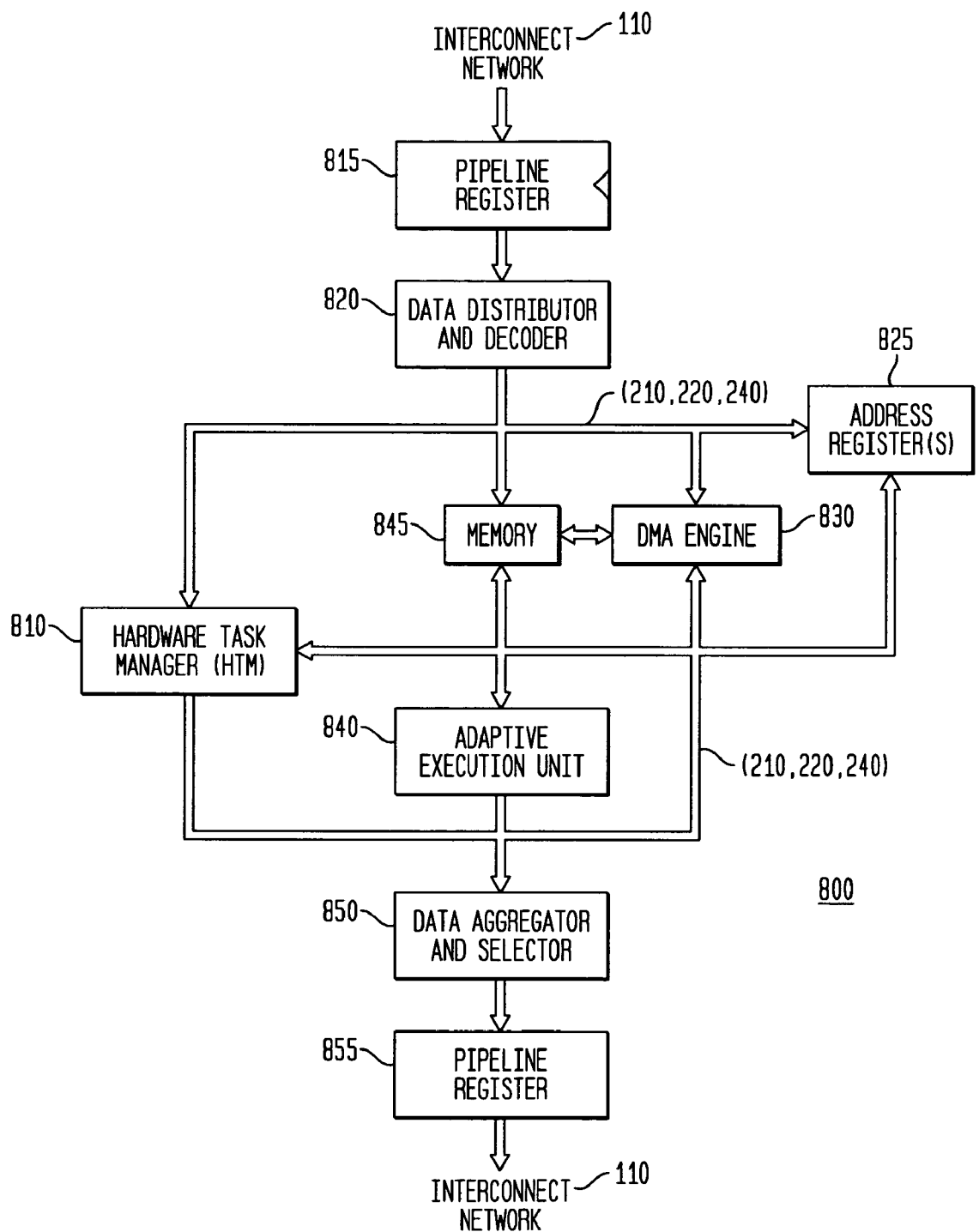
FIG. 10 is a block diagram illustrating a second exemplary apparatus embodiment in accordance with the present invention.

FIG. 10 is a block diagram illustrating a prototypical node or matrix 800 comprising the second apparatus embodiment. The node 800 is connected to other nodes 150 within the ACE 100 through the matrix interconnection network 110. The prototypical node 800 includes a fixed (and non-reconfigurable) "node wrapper", an adaptive (reconfigurable) execution unit 840, and a memory 845 (which also may be variable). This fixed and non-reconfigurable "node wrapper" includes an input pipeline register 815, a data decoder and distributor 820, a hardware task manager 810, an address register 825 (optional), a DMA engine 830 (optional), a data aggregator and selector 850, and an output pipeline register 855. These components comprising the node wrapper are generally common to all nodes of the ACE 100, and are comprised of fixed architectures (i.e., application-specific or non-reconfigurable architectures). As a consequence, the node or matrix 800 is a unique blend of fixed, non-reconfigurable node wrapper components, memory, and the reconfigurable components of an adaptive execution unit 840 (which, in turn, are comprised of fixed computational elements and an interconnection network).

Various nodes 800, in general, will have a distinctive and variably-sized adaptive execution unit 840, tailored for one or more particular applications or algorithms, and a memory 845, also implemented in various sizes depending upon the requirements of the adaptive execution unit 840. An adaptive execution unit 840 for a given node 800 will generally be different than the adaptive execution units 840 of the other nodes 800. Each adaptive execution unit 840 is reconfigurable in response to configuration information, and is comprised of a plurality of computation units 200, which are in turn further comprised of a plurality of computational elements 250, and corresponding interconnect networks 210, 220 and 240. Particular adaptive execution units 840 utilized in exemplary embodiments, and the operation of the node 800 and node wrapper, are discussed in greater detail below.

Figure 11:
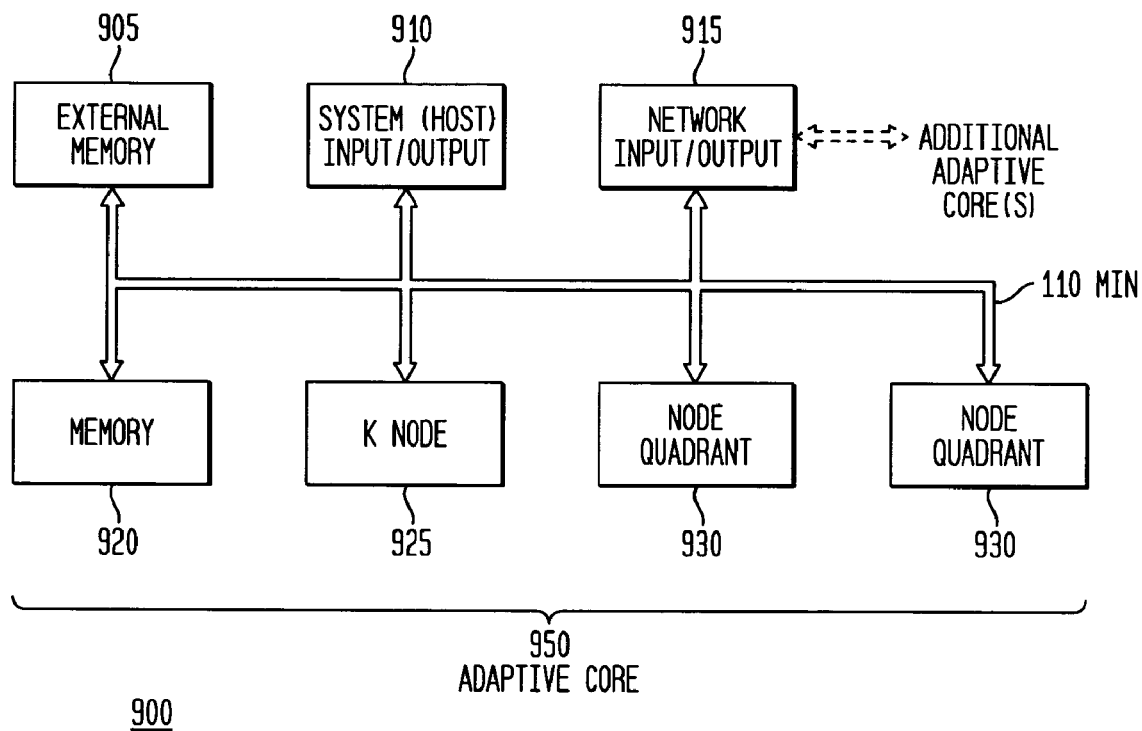
FIG. 11 is a block diagram illustrating an exemplary first system embodiment in accordance with the present invention.

FIG. 11 is a block diagram illustrating a first system embodiment 900. This first system 900 may be included as part of a larger system or host environment, such as within a computer or communications device, for example. FIG. 11 illustrates a "root" level of such a system 100, where global resources have connectivity (or otherwise may be found). At this root level, the first system 900 includes one or more adaptive cores 950, external (off-IC or off-chip) memory 905 (such as SDRAM), host (system) input and output connections, and network (MIN 110) input and output connections (for additional adaptive cores 950). Each adaptive core 950 includes (on-IC or on-chip) memory 920, a "K-node" 925, and one or more sets of nodes (150, 800) referred to as a node quadrant 930. The K-node 925 (like the kernel controller 150A) provides an operating system for the adaptive core 950. Generally, each node quadrant 930 consists of 16 nodes in a scalable by-four (×4) fractal arrangement. At this root level, each of these (seven) illustrated elements has total connectivity with all other (six) elements. As a consequence, the output of a root-level element is provided to (and may drive) all other root-level inputs, and the input of each root-level input is provided with the outputs of all other root-level elements. Not separately illustrated, at this root-level of the first system 900, the MIN 110 includes a network with routing (or switching) elements (935), such as round-robin, token ring, cross point switches, or other arbiter elements, and a network (or path) for real time data transfer (or transmission) (such as a data network 240).

Figure 12:
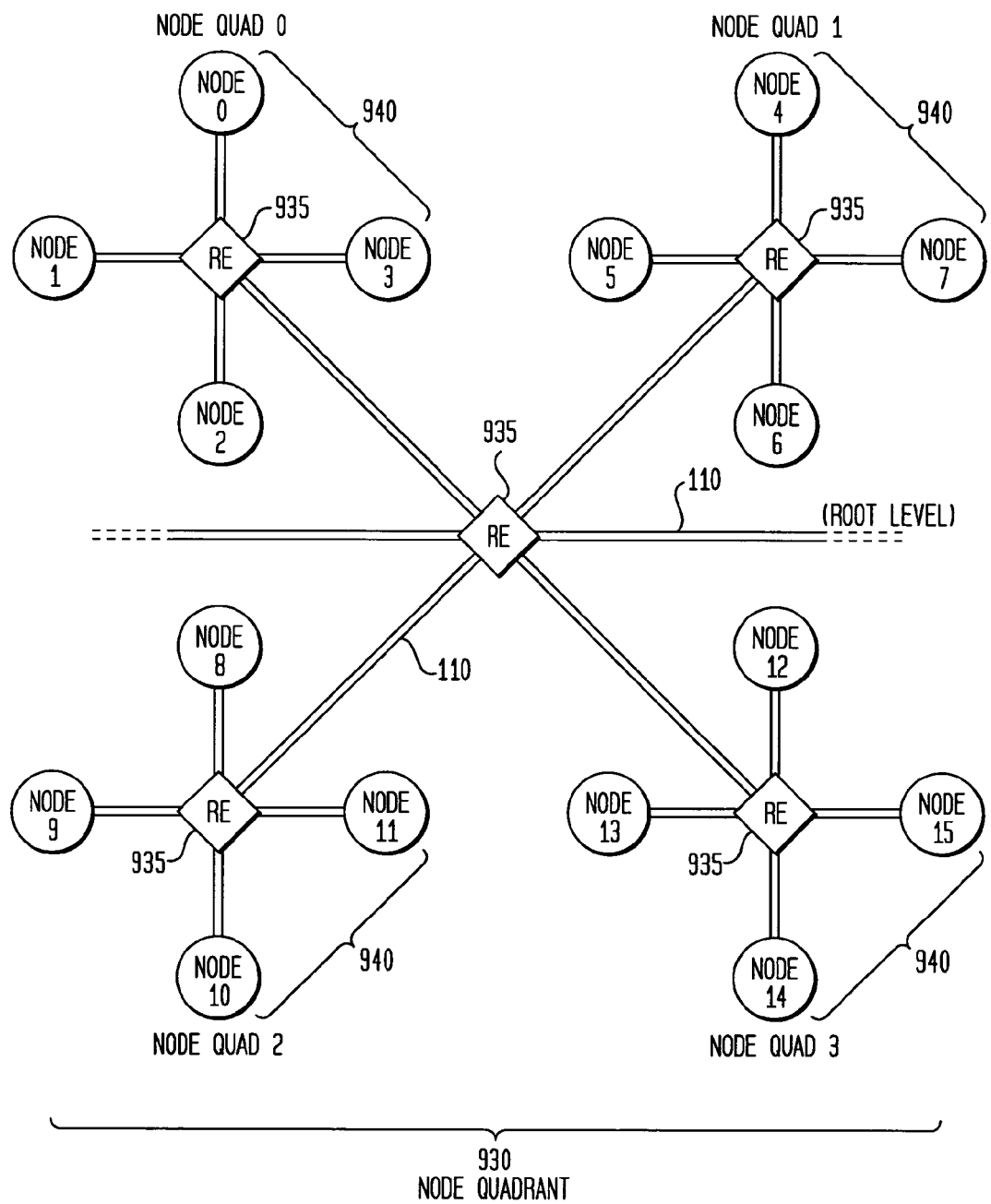
FIG. 12 is a block diagram illustrating an exemplary node quadrant with routing elements in accordance with the present invention.

FIG. 12 is a block diagram illustrating an exemplary node quadrant 930 with routing elements 935. From the root-level, the node quadrant 930 has a tree topology and consists of 16 nodes (150 or 800), with every four nodes connected as a node "quad" 940 having a routing (or switching) element 935. The routing elements may be implemented variously, such as through round-robin, token ring, cross point switches, (four-way) switching, ($\frac{1}{4}$, $\frac{1}{3}$ or $\frac{1}{2}$) arbitration or other arbiter or arbitration elements, or depending upon the degree of control overhead which may be tolerable, through other routing or switching elements such as multiplexers and demultiplexers. This by-four fractal architecture provides for routing capability, scalability, and expansion, without logical limitation. The node quadrant 930 is coupled within the first system 900 at the root-level, as illustrated. This by-four fractal architecture also provides for significant and complete connectivity, with the worst-case distance between any node being $\log_4$ of "k" hops (or number of nodes) (rather than a linear distance), and provides for avoiding the overhead and capacitance of, for example, a full crossbar switch or busses.

The node quadrant 930 and node quad 940 structures exhibit a fractal self-similarity with regard to scalability, repeating structures, and expansion. The node quadrant 930 and node quad 940 structures also exhibit a fractal self-similarity with regard to a heterogeneity of the plurality of heterogeneous and reconfigurable nodes 800, heterogeneity of the plurality of heterogeneous computation units 200, and heterogeneity of the plurality of heterogeneous computational elements 250. With regard to the increasing heterogeneity, the adaptive computing integrated circuit 900 exhibits increasing heterogeneity from a first level of the plurality of heterogeneous and reconfigurable matrices, to a second level of the plurality of heterogeneous computation units, and further to a third level of the plurality of heterogeneous computational elements. The plurality of interconnection levels also exhibit a fractal self-similarity with regard to each interconnection level of the plurality of interconnection levels. At increasing depths within the ACE 100, from the matrix 150 level to the computation unit 200 level and further to the computational element 250 level, the interconnection network is increasingly rich, providing an increasing amount of bandwidth and an increasing number of connections or connectability for a correspondingly increased level of reconfigurability. As a consequence, the matrix-level interconnection network, the computation unit-level interconnection network, and the computational element-level interconnection network also constitute a fractal arrangement.

Referring to FIGS. 11 and 12, and as explained in greater detail below, the system embodiment 900 utilizes point-to-point service for streaming data and configuration information transfer, using a data packet (or data structure) discussed below. A packet-switched protocol is utilized for this communication, and in an exemplary embodiment the packet length is limited to a single word (of length 51 bits) to obviate any need for data buffering. The routing information within the data packet provides for selecting the particular adaptive core 950, followed by selecting root-level (or not) of the selected adaptive core 950, followed by selecting a particular node (110 or 800) of the selected adaptive core 950. This selection path may be visualized by following the illustrated connections of FIGS. 11 and 12. Routing of data packets out of a particular node may be performed similarly, or may be provided more directly, such as by switching or arbitrating within a node 800 or quad 940, as discussed below.

Figure 13:
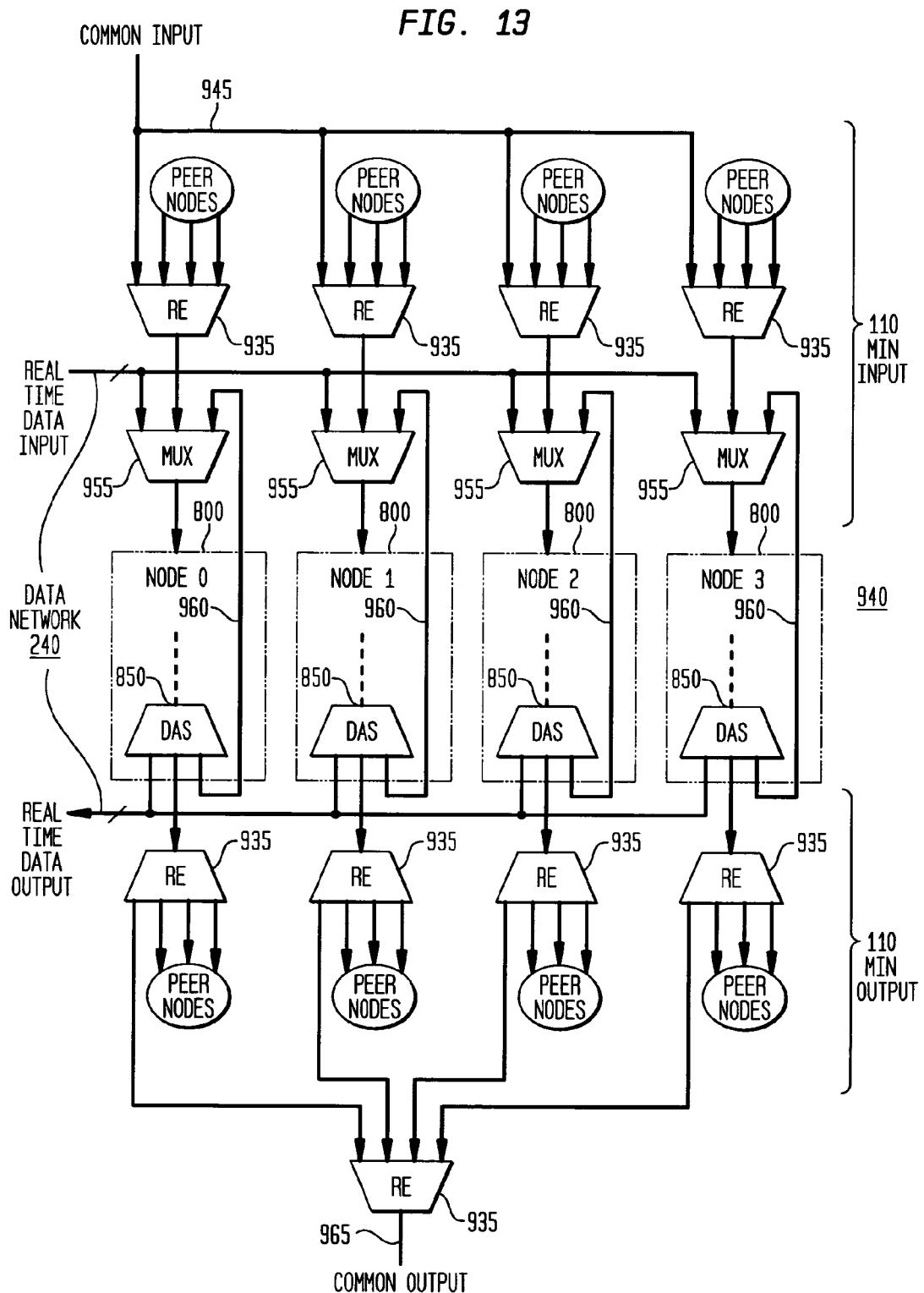
FIG. 13 is a block diagram illustrating exemplary network interconnections in accordance with the present invention.

FIG. 13 is a block diagram illustrating exemplary network interconnections into and out of nodes 800 and node quads 940. Referring to FIG. 13, MIN 100 connections into a node, via a routing element 935, include a common input 945 (provided to all four nodes 800 within a quad 940), and inputs from the other (three) "peer" nodes within the particular quad 940. For example, outputs from peer nodes 1, 2 and 3 are utilized for input into node 0, and so on. At this level, the routing element 935 may be implemented, for example, as a round-robin, token ring, arbiter, cross point switch, or other four-way switching element. The output from the routing element 935 is provided to a multiplexer 955 (or other switching element) for the corresponding node 800, along with a feedback input 960 from the corresponding node 800, and an input for real time data (from data network 240) (to provide a fast track for input of real time data into nodes 800). The multiplexer 955 (or other switching element) provides selection (switching or arbitration) of one of 3 inputs, namely, selection of input from the selected peer or common 945, selection of input from the same node as feedback, or selection of input of real time data, with the output of the multiplexer 955 provided as the network (MIN 110) input into the corresponding node 800 (via the node's pipeline register 815).

The node 800 output is provided to the data aggregator and selector ("DAS") 850 within the node 800, which determines the routing of output information to the node itself (same node feedback), to the network (MIN 110) (for routing to another node or other system element), or to the data network 240 (for real time data output). When the output information is selected for routing to the MIN 110, the output from the DAS 850 is provided to the corresponding output routing element 935, which routes the output information to peer nodes within the quad 940 or to another, subsequent routing element 935 for routing out of the particular quad 940 through a common output 965 (such for routing to another node quad 940, node quadrant 930, or adaptive core 950).

Figure 14:
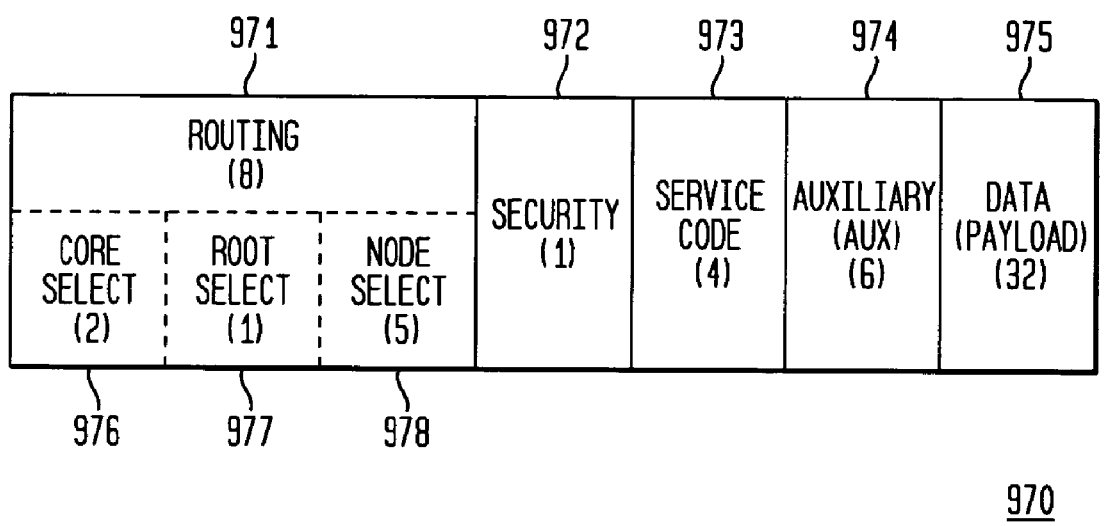
FIG. 14 is a block diagram illustrating an exemplary data structure embodiment in accordance with the present invention.

FIG. 14 is a block diagram illustrating an exemplary data structure embodiment. The system embodiment 900 utilizes point-to-point data and configuration information transfer, using a data packet (as an exemplary data structure) 970, and may be considered as an exemplary form of "silverware", as previously described herein. The exemplary data packet 970 provides for 51 bits per packet, with 8 bits provided for a routing field (971), 1 bit for a security field (972), 4 bits for a service code field (973), 6 bits for an auxiliary field (974), and 32 bits (one word length) for data (as a data payload or data field) (975). As indicated above, the routing field 971 may be further divided into fields for adaptive core selection (976), root selection (977), and node selection (978). In this selected 51-bit embodiment, up to four adaptive cores may be selected, and up to 32 nodes per adaptive core. As the packet is being routed, the routing bits may be stripped from the packet as they are being used in the routing process. The service code field 973 provides for designations such as point-to-point inter-process communication, acknowledgements for data flow control, "peeks" and "pokes" (as coined terminology referring to reads and writes by the K-node into memory 845), DMA operations (for memory moves), and random addressing for reads and writes to memory 845. The auxiliary (AUX) field 974 supports up to 32 streams for any of up to 32 tasks for execution on the adaptive execution unit 840, as discussed below, and may be considered to be a configuration information payload. The one word length (32-bit) data payload is then provided in the data field 975. The exemplary data structure 970 (as a data packet) illustrates the interdigitation of data and configuration/control information, as discussed above.

Referring to FIG. 10, in light of the first system 900 structure and data structure discussed above, the node 800 architecture of the second apparatus embodiment may be described in more detail. The input pipeline register 815 is utilized to receive data and configuration information from the network interconnect 110. Preferably, the input pipeline register 815 does not permit any data stalls. More particularly, in accordance with the data flow modeling of the present invention, the input pipeline register 815 should accept new data from the interconnection network 110 every clock period; consequently, the data should also be consumed as it is produced. This imposes the requirement that any contention issues among the input pipeline register 815 and other resources within the node 800 be resolved in favor of the input pipeline register 815, i.e., input data in the input pipeline register has priority in the selection process implemented in various routing (or switching) elements 935, multiplexers 955, or other switching or arbitration elements which may be utilized.

The data decoder and distributor 820 interfaces the input pipeline register 815 to the various memories (e.g., 845) and registers (e.g., 825) within the node 800, the hardware task manager 810, and the DMA engine 830, based upon the values in the service and auxiliary fields of the 51-bit data structure. The data decoder 820 also decodes security, service, and auxiliary fields of the 51-bit network data structure (of the configuration information or of operand data) to direct the received word to its intended destination within the node 800.

Conversely, data from the node 800 to the network (MIN 110 or to other nodes) is transferred via the output pipeline register 855, which holds data from one of the various memories (845) or registers (e.g., 825 or registers within the adaptive execution unit 840) of the node 800, the adaptive execution unit 840, the DMA engine 830, and/or the hardware task manager 810. Permission to load data into the output pipeline register 855 is granted by the data aggregator and selector (DAS) 850, which arbitrates or selects between and among any competing demands of the various (four) components of the node 800 (namely, requests from the hardware task manager 810, the adaptive execution unit 840, the memory 845, and the DMA engine 830). The data aggregator and selector 850 will issue one and only one grant whenever there is one or more requests and the output pipeline register 855 is available. In the selected embodiment, the priority for issuance of such a grant is, first, for K-node peek (read) data; second, for the adaptive execution unit 840 output data; third, for source DMA data; and fourth, for hardware task manager 810 message data. The output pipeline register 855 is available when it is empty or when its contents will be transferred to another register at the end of the current clock cycle.

The DMA engine 830 of the node 800 is an optional component. In general, the DMA engine 830 will follow a five register model, providing a starting address register, an address stride register, a transfer count register, a duty cycle register, and a control register. The control register within the DMA engine 830 utilizes a GO bit, a target node number and/or port number, and a DONE protocol. The K-node 925 writes the registers, sets the GO bit, and receives a DONE message when the data transfer is complete. The DMA engine 830 facilitates block moves from any of the memories of the node 800 to another memory, such as an on-chip bulk memory, external SDRAM memory, another node's memory, or a K-node memory for diagnostics and/or operational purposes. The DMA engine 830, in general, is controlled by the K-node 925.

The hardware task manager 810 is configured and controlled by the K-node 925 and interfaces to all node components except the DMA engine 830. The hardware task manager 810 executes on each node 800, processing a task list and producing a task ready-to-run queue implemented as a first in—first out (FIFO) memory. The hardware task manager 810 has a top level finite state machine that interfaces with a number of subordinate finite state machines that control the individual hardware task manager components. The hardware task manager 810 controls the configuration and reconfiguration of the computational elements 250 within the adaptive execution unit 840 for the execution of any given task by the adaptive execution unit 840.

The K-node 925 initializes the hardware task manager 810 and provides it with set up information for the tasks needed for a given operating mode, such as operating as a communication processor or an MP3 player. The K-node 925 provides configuration information as a stored (task) program within memory 845 and within local memory within the adaptive execution unit 840. The K-node 925 initializes the hardware task manager 810 (as a parameter table) with designations of input ports, output ports, routing information, the type of operations (tasks) to be executed (e.g., FFT, DCT), and memory pointers. The K-node 925 also initializes the DMA engine 830.

The hardware task manager 810 maintains a port translation table and generates addresses for point-to-point data delivery, mapping input port numbers to a current address of where incoming data should be stored in memory 845. The hardware task manager 810 provides data flow control services, tracking both production and consumption of data, using corresponding production and consumption counters, and thereby determines whether a data buffer is available for a given task. The hardware task manager 810 maintains a state table for tasks and, in the selected embodiment, for up to 32 tasks. The state table includes a GO bit (which is enabled or not enabled (suspended) by the K-node 925), a state bit for the task (idle, ready-to-run, run (running)), an input port count, and an output port count (for tracking input data and output data). In the selected embodiment, up to 32 tasks may be enabled at a given time. For a given enabled task, if its state is idle, and if sufficient input data (at the input ports) are available and sufficient output ports are available for output data, its state is changed to ready-to-run and queued for running (transferred into a ready-to-run FIFO or queue). Typically, the adaptive execution unit 840 is provided with configuration information (or code) and two data operands (x and y).

From the ready-to-run queue, the task is transferred to an active task queue, the adaptive execution unit 840 is configured for the task (set up), the task is executed by the adaptive execution unit 840, and output data is provided to the data aggregator and selector 850. Following this execution, the adaptive execution unit 840 provides an acknowledgement message to the hardware task manager 810, requesting the next item. The hardware task manager 810 may then direct the adaptive execution unit 840 to continue to process data with the same configuration in place, or to tear down the current configuration, acknowledge completion of the tear down and request the next task from the ready-to-run queue. Once configured for execution of a selected algorithm, new configuration information is not needed from the hardware task manager 810, and the adaptive execution unit 840 functions effectively like an ASIC, with the limited additional overhead of acknowledgement messaging to the hardware task manager 810. These operations are described in additional detail below.

A module is a self-contained block of code (for execution by a processor) or a hardware-implemented function (embodied as configured computational elements 250), which is processed or performed by an execution unit 840. A task is an instance of a module, and has four states: suspend, idle, ready or run. A task is created by associating the task to a specific module (computational elements 250) on a specific node 800; by associating physical memories and logical input buffers, logical output buffers, logical input ports and logical output ports of the module; and by initializing configuration parameters for the task. A task is formed by the K-node writing the control registers in the node 800 where the task is being created (i.e., enabling the configuration of computational elements 250 to perform the task), and by the K-node writing to the control registers in other nodes, if any, that will be producing data for the task and/or consuming data from the task. These registers are memory mapped into the K-node's address space, and "peek and poke" network services are used to read and write these values. A newly created task starts in the "suspend" state.

Once a task is configured, the K-node can issue a "go" command, setting a bit in a control register in the hardware task manager 810. The action of this command is to move the task from the "suspend" state to the "idle" state. When the task is "idle" and all its input buffers and output buffers are available, the task is added to the "ready-to-run" queue which is implemented as a FIFO; and the task state is changed to "ready/run". Buffers are available to the task when subsequent task execution will not consume more data than is present in its input buffers or will not produce more data than there is capacity in its output buffers.

When the adaptive execution unit 840 is not busy and the FIFO is not empty, the task number for the next task that is ready to execute is removed from the FIFO, and the state of this task is "run". In the "run" state, the task (executed by the configured adaptive execution unit 840) consumes data from its input buffers and produces data for its output buffers.

The adaptive execution units 840 will vary depending upon the type of node 800 implemented. Various adaptive execution units 840 may be specifically designed and implemented for use in heterogeneous nodes 800, for example, for a programmable RISC processing node; for a programmable DSP node; for an adaptive or reconfigurable node for a particular domain, such as an arithmetic node; and for an adaptive bit-manipulation unit (RBU). Various adaptive execution units 840 are discussed in greater detail below.

For example, a node 800, through its execution unit 840, will perform an entire algorithmic element in a comparatively few clock cycles, such as one or two clock cycles, compared to performing a long sequence of separate operations, loads/stores, memory fetches, and so on, over many hundreds or thousands of clock cycles, to eventually achieve the same end result. Through its computational elements 250, the execution unit 840 may then be reconfigured to perform another, different algorithmic element. These algorithmic elements are selected from a plurality of algorithmic elements comprising, for example: a radix-2 Fast Fourier Transformation (FFT), a radix-4 Fast Fourier Transformation (FFT), a radix-2 Inverse Fast Fourier Transformation (IFFT), a radix-4 Inverse Fast Fourier Transformation (IFFT), a one-dimensional Discrete Cosine Transformation (DCT), a multi-dimensional Discrete Cosine Transformation (DCT), finite impulse response (FIR) filtering, convolutional encoding, scrambling, puncturing, interleaving, modulation mapping, Golay correlation, OVSF code generation, Haddamard Transformation, Turbo Decoding, bit correlation, Griffiths LMS algorithm, variable length encoding, uplink scrambling code generation, downlink scrambling code generation, downlink despreading, uplink spreading, uplink concatenation, Viterbi encoding, Viterbi decoding, cyclic redundancy coding (CRC), complex multiplication, data compression, motion compensation, channel searching, channel acquisition, and multipath correlation.

In an exemplary embodiment, a plurality of different nodes 800 are created, by varying the type and amount of computational elements 250 (forming computational units 200), and varying the type, amount and location of interconnect (with switching or routing elements) which form the execution unit 840 of each such node 800. In the exemplary embodiment, two different nodes 800 perform, generally, arithmetic or mathematical algorithms, and are referred to as adaptive (or reconfigurable) arithmetic nodes (AN), as AN1 and AN2. For example, the AN1 node, as a first node 800 of the plurality of heterogeneous and reconfigurable nodes, comprises a first selection of computational elements 250 from the plurality of heterogeneous computational elements to form a first reconfigurable arithmetic node for performance of Fast Fourier Transformation (FFT) and Discrete Cosine Transformation (DCT). Continuing with the example, the AN2 node, as a second node 800 of the plurality of heterogeneous and reconfigurable nodes, comprises a second selection of computational elements 250 from the plurality of heterogeneous computational elements to form a second reconfigurable arithmetic node, the second selection different than the first selection, for performance of at least two of the following algorithmic elements: multi-dimensional Discrete Cosine Transformation (DCT), finite impulse response (FIR) filtering, OVSF code generation, Haddamard Transformation, bitwise WCDMA Turbo interleaving, WCDMA uplink concatenation, WCDMA uplink repeating, and WCDMA uplink real spreading and gain scaling.

Also in the exemplary embodiment, a plurality of other types of nodes 800 are defined, such as, for example:

A bit manipulation node, as a third node of the plurality of heterogeneous and reconfigurable nodes, comprising a third selection of computational elements 250 from the plurality of heterogeneous computational elements, the third selection different than the first selection, for performance of at least two of the following algorithmic elements: variable and multiple rate convolutional encoding, scrambling code generation, puncturing, interleaving, modulation mapping, complex multiplication, Viterbi algorithm, Turbo encoding, Turbo decoding, correlation, linear feedback shifting, downlink despreading, uplink spreading, CRC encoding, de-puncturing, and de-repeating.

A reconfigurable filter node, as a fourth node of the plurality of heterogeneous and reconfigurable nodes, comprising a fourth selection of computational elements 250 from the plurality of heterogeneous computational elements, the fourth selection different than the first selection, for performance of at least two of the following algorithmic elements: adaptive finite impulse response (FIR) filtering, Griffith's LMS algorithm, and RRC filtering.

A reconfigurable finite state machine node, as a fifth node of the plurality of heterogeneous and reconfigurable nodes, comprising a fifth selection of computational elements 250 from the plurality of heterogeneous computational elements, the fifth selection different than the first selection, for performance of at least two of the following processes: control processing; routing data and control information between and among the plurality of heterogeneous computational elements 250; directing and scheduling the configuration of the plurality of heterogeneous computational elements for performance of a first algorithmic element and the reconfiguration of the plurality of heterogeneous computational elements for performance of a second algorithmic element; timing and scheduling the configuration and reconfiguration of the plurality of heterogeneous computational elements with corresponding data; controlling power distribution to the plurality of heterogeneous computational elements and the interconnection network; and selecting the first configuration information and the second configuration information from a singular bit stream comprising data commingled with a plurality of configuration information.

A reconfigurable multimedia node, as a sixth node of the plurality of heterogeneous and reconfigurable nodes, comprising a sixth selection of computational elements 250 from the plurality of heterogeneous computational elements, the sixth selection different than the first selection, for performance of at least two of the following algorithmic elements: radix-4 Fast Fourier Transformation (FFT); multi-dimensional radix-2 Discrete Cosine Transformation (DCT); Golay correlation; adaptive finite impulse response (FIR) filtering; Griffith's LMS algorithm; and RRC filtering.

A reconfigurable hybrid node, as a seventh node of the plurality of heterogeneous and reconfigurable nodes, comprising a seventh selection of computational elements 250 from the plurality of heterogeneous computational elements, the seventh selection different than the first selection, for performance of arithmetic functions and bit manipulation functions.

A reconfigurable input and output (I/O) node, as an eighth node of the plurality of heterogeneous and reconfigurable nodes, comprising an eighth selection of computational elements 250 from the plurality of heterogeneous computational elements, the eighth selection different than the first selection, for adaptation of input and output functionality for a plurality of types of I/O standards, the plurality of types of I/O standards comprising standards for at least two of the following: PCI busses, Universal Serial Bus types one and two (USB1 and USB2), and small computer systems interface (SCSI).

A reconfigurable operating system node, as a ninth node of the plurality of heterogeneous and reconfigurable nodes, comprising a ninth selection of computational elements 250 from the plurality of heterogeneous computational elements, the ninth selection different than the first selection, for storing and executing a selected operating system of a plurality of operating systems.

Figure 15:
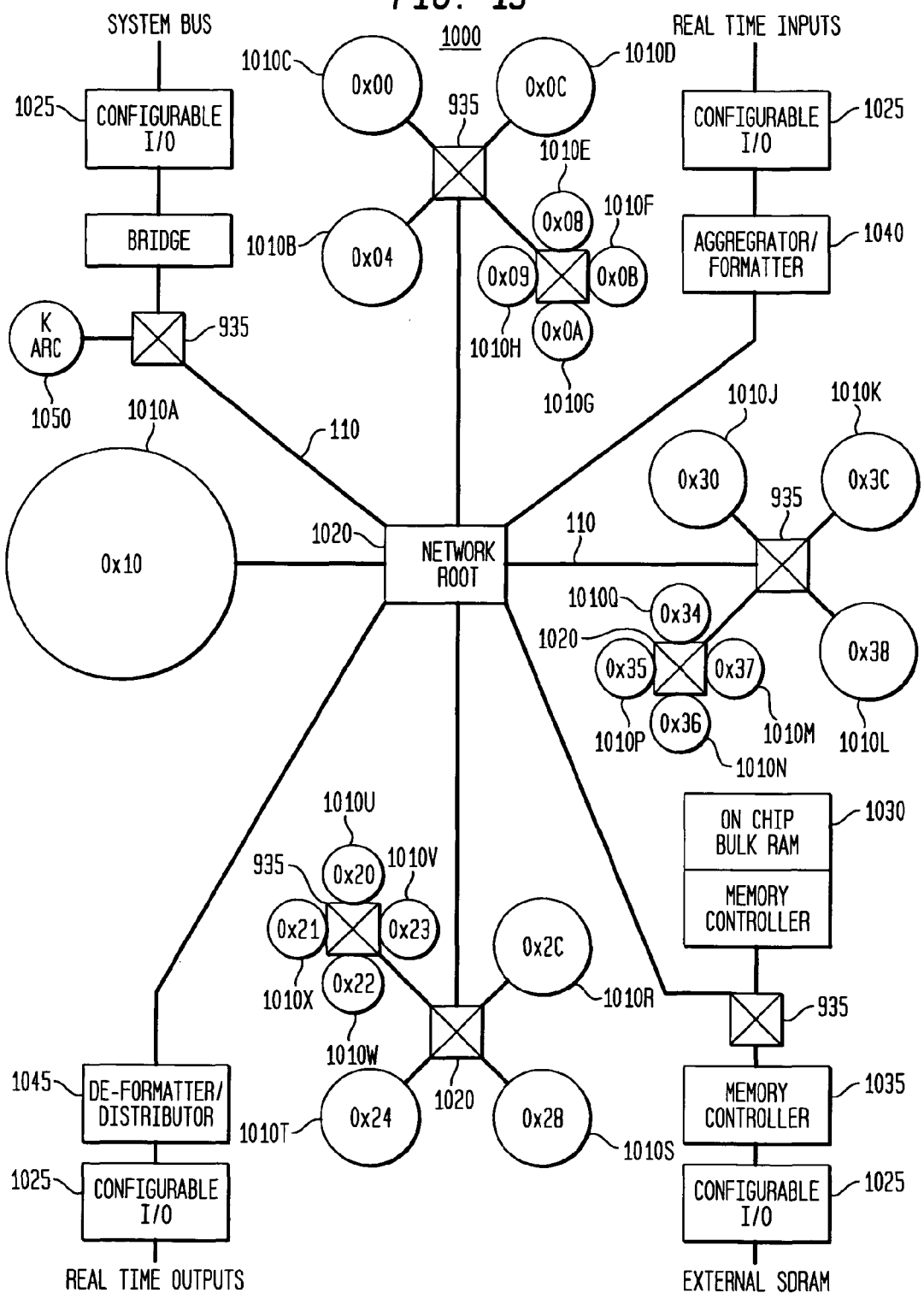
FIG. 15 is a block diagram illustrating an exemplary second system embodiment in accordance with the present invention.

FIG. 15 is a block diagram illustrating a second system embodiment 1000 in accordance with the present invention. The second system embodiment 1000 is comprised of a plurality of variably-sized nodes (or matrices) 1010 (illustrated as nodes 1000A through 1010X), with the illustrated size of a given node 1010 also indicative of an amount of computational elements 250 within the node 1010 and an amount of memory included within the node 1010 itself. The nodes 1010 are coupled to an interconnect network 110, for configuration, reconfiguration, routing, and so on, as discussed above. The second system embodiment 1000 illustrates node 800 and system configurations which are different and more varied than the quadrant 930 and quad 940 configurations discussed above.

As illustrated, the second system embodiment 1000 is designed for use with other circuits within a larger system and, as a consequence, includes configurable input/output (I/O) circuits 1025, comprised of a plurality of heterogeneous computational elements configurable (through corresponding interconnect, not separately illustrated) for I/O functionality. The configurable input/output (I/O) circuits 1025 provide connectivity to and communication with a system bus (external), external SDRAM, and provide for real time inputs and outputs. A K-node (KARC) 1050 provides the K-node (KARC) functionality discussed above. The second system embodiment 1000 further includes memory 1030 (as on-chip RAM, with a memory controller), and a memory controller 1035 (for use with the external memory (SDRAM)). Also included in the apparatus 1000 are an aggregator/formatter 1040 and a de-formatter/distributor 1045, providing functions corresponding to the functions of the data aggregator and selector 850 and data distributor and decoder 820, respectively, but for the larger system 1000 (rather than within a node 800).

Referring again to FIG. 10, as previously mentioned, the node 800 can be tailored, via varying the configuration of the adaptive execution unit 840 and the size of the memory 845, to perform one or more particular applications or algorithms. By varying the type and amount of computational elements 250 and by varying the type, amount and location of interconnect (110, 210, 220, 240), any number of different types of nodes 800 may be created. For example, it may be desirable to configure the adaptive execution unit 840 and the memory 845 in one or more nodes 800 of an ACE 100 to perform optical data processing to produce a processed digital image, such as for use in a digital camera, a video camera, video telephony applications, digital TV, digital cinema, a fax machine, a photocopier, or any number of other devices that create or reproduce an image from visible spectrum (light) signals.

Typical conventional cameras, including both single lens reflex (SLR) and compact camera types, are DSP or microprocessor-based devices. In general, one or more optical sensors, such as a charge-coupled device ("CCD"), detect the amount of light entering the camera. That amount of light varies depending on the object image captured by the lens system of the camera. The resulting data produced by the camera's optical sensor, herein referred to as a detected image of the object, is processed by the microprocessor or DSP and used to adjust camera settings, such as for proper exposure and focus (e.g., lens aperture size, shutter speed, flash charge, autofocus, etc.). In the case of a conventional digital camera, the resulting (analog) data from the CCD is converted to digital data and is processed by the microprocessor or DSP to produce a digital form of the original, detected image, referred to herein as a processed digital image. As previously mentioned, however, microprocessors are comparatively inefficient in the performance of actual algorithmic operations—in this case, algorithms used to adjust camera settings and algorithms to produce a digitized image—and consequently consume significantly more IC area and significantly more power compared to other types of ICs such as the ACE 100.

Figure 16B:
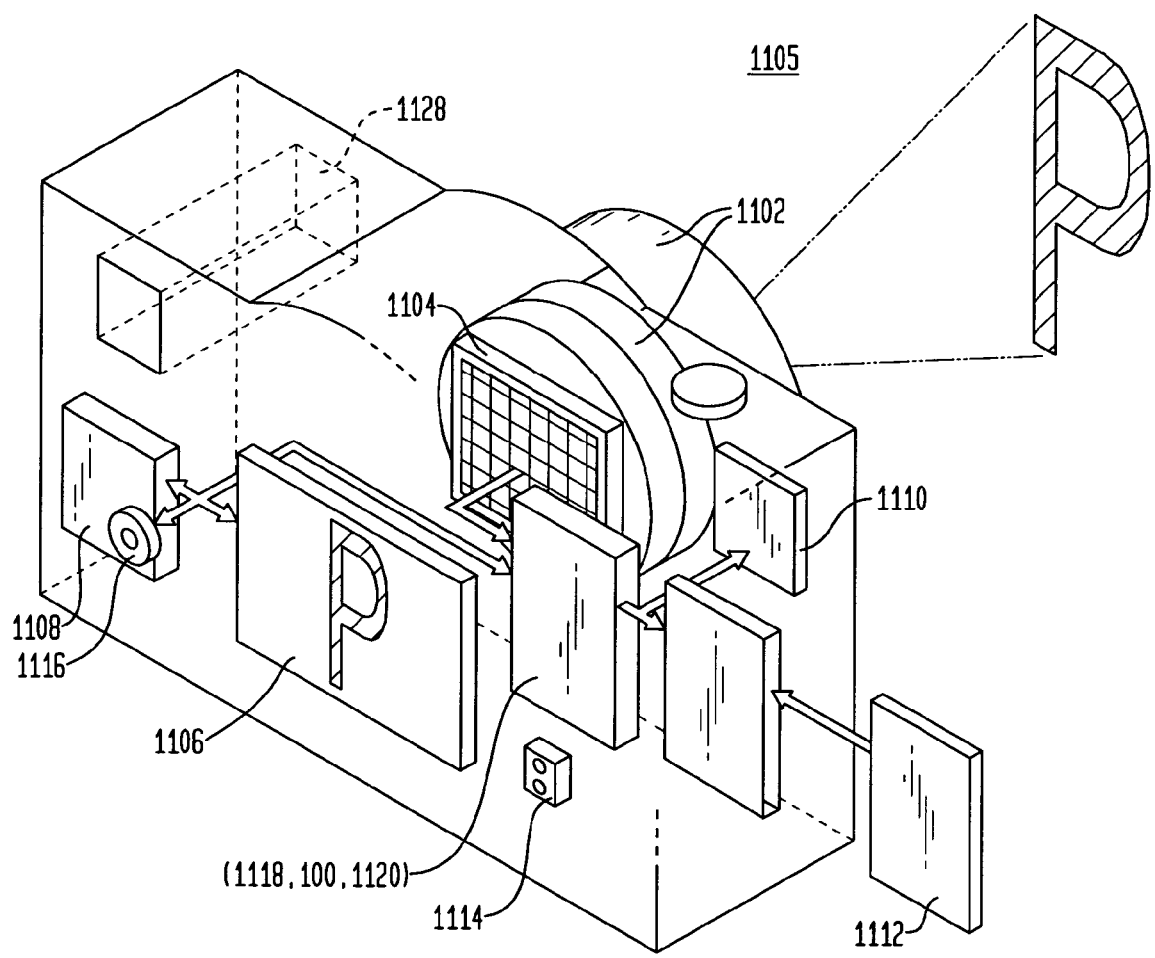
FIG. 16B is a perspective view of the exemplary digital camera in accordance with the present invention.

FIG. 16A is a block diagram of an exemplary digital camera 1100 in accordance with the present invention. FIG. 16B is a perspective view of the exemplary digital camera 1100 in accordance with the present invention. The exemplary digital camera 1100 utilizes the adaptive computing engine (ACE) 100 to process and provide a processed digital image to a variety of outputs, and to adjust any applicable camera settings. The digital camera 1100 includes a focusing means 1102 (e.g., a lens, shutter, aperture, filters, motor, and so on); an optical sensor 1104 of which a CCD is a type; an analog-to-digital ("A/D") converter 1118 (which also may be included within the ACE 100); the ACE 100 (e.g., one or more nodes 800); one or more memories such as a memory IC 1110 and a removable memory or storage medium 1112 (e.g., flash, DRAM, SRAM, SDRAM, FeRAM, MRAM, ROM, EPROM and/or E$^2$PROM); an analog output interface 1108 to interface the digital output of the ACE 100 (a processed digital image or a plurality of processed digital image data packets) with one or more analog output ports, such as a television output port 1116 and a view (viewfinder) screen 1106; a digital output interface 1120, in some embodiments, to interface the digital output of the ACE 100 (as a plurality of processed digital image data packets) with one or more digital output ports, such as a computer output port 1114 (or, not separately illustrated, a printer port, a data transmission port, etc.); and an optional optical viewfinder 1118. The viewfinder screen 1106 of the exemplary digital camera 1110 is preferably a color liquid crystal display (LCD) screen, although other types of suitable screens may be used. In addition, although flash memory is typically used as the removable memory 1112 for storing processed digital images created by the exemplary digital camera 1110, processed digital images may also be stored on any other form of memory such as other memory ICs, diskettes, CDs, PC or PCMCIA cards (or any other suitable storage medium having physical size, weight, aspect, and other properties suitable for the design of the particular imaging device, such as suitable for the portability of a hand-held camera, and so on).

Instead of capturing images on film, which undergoes a chemical change when exposed to light, the digital camera 1100 uses an optical sensor 1104 having a light sensitive array (organized or typically referred to as pixels) which creates an electrical signal of some kind for each pixel or element, that is subsequently converted to digital form. Light transmitted or reflected from an object is projected or focused (by focusing means 1102), as an object image, onto the optical sensor (1104, 1204). Optical sensing in the digital camera 1100 typically maybe performed by a charge-coupled device (CCD), from the object image projected onto the optical sensor 1104, to produce a detected image. For example, when embodied as a CCD, the optical sensor 1104 is a semiconductor material in which charge is transferred through storage areas. The charge (i.e., electrical signals) output from the optical sensor 1104 is then provided to the A/D converter 1108. The A/D converter 1118 samples and converts the electric signals into a digital form (i.e., provides a digital value corresponding to the level of charge on each optical sensor element), providing digital image information representing the detected image (which was detected from the object image projected onto the optical sensor 1104 by the focusing means 1102). Depending upon the selected embodiment, this digital image information from A/D converter 1118 may also be provided (to a node 800) as a plurality of digital image information data packets, such as digital image information data packets having a data structure illustrated in FIG. 14.

The digital image information (or plurality of digital image information data packets) is provided to the ACE 100 where it is processed to produce a processed digital image (or, equivalently, a plurality of processed digital image data packets). From the ACE 100, the processed digital image (or the plurality of processed digital image data packets) is provided to the various outputs, for example: to the memory 1110; to the removable (or replaceable) memory 1112 (possibly via the a digital output interface 1120) for long term storage or for use to print a digital photograph from the processed digital image; to the digital output interface 1120 (optionally); to various digital ports (such as computer port 1114 or a printer port, not separately illustrated); and to the analog output interface 1108, for conversion to an analog form suitable for display on the either the view (viewfinder) screen 1106 or a television screen (via an analog output port such as the television output port 1116).

As indicated above, data is generally transferred on the MIN 110 in the form of data packets, such as data packets having the structure illustrated in FIG. 14. As a consequence, depending upon the selected embodiment, the digital image information from the A/D converter 1118 may have the form of a plurality of digital image information data packets, which are provided to the input pipeline register 815 of a node 800.

Also depending on the selected embodiment, such as when a plurality of nodes 800 are utilized to form the ACE 100, the various nodes 800 provide output data packets via output pipeline register 855. For digital imaging, these output data packets have a data payload of a plurality of data words comprising the processed digital image, i.e., the output data packets are a plurality of processed digital image data packets. A digital output interface (1120 or 1222 in FIG. 17) may then assemble the data words of the plurality of processed digital image data packets to form the overall or entire processed digital image (which then may be printed, copied, stored, converted to an analog form, and so on). In other embodiments, the various digital imaging applications may be able to directly utilize the plurality of processed digital image data packets and, if so, use of such a digital output interface to assemble a processed digital image from the plurality of processed digital image data packets is not required in the apparatus 1100. Similarly, for an analog output, an analog output interface 1108 that converts the processed digital image to an analog form (such as digital-to-analog ("D/A") conversion) may similarly provide such assembly of a processed digital image from the data word payloads of the plurality of processed digital image data packets (then followed by conversion to an analog form).

Designs of an optical sensor 1104 (such as a CCD) used in the exemplary digital camera 1100 (or the optical sensor 1204, discussed below) may vary from application to application; for purposes of the present invention, the optical sensor need only convert light signals projected or reflected from an object (generally through focusing means 1102) to an electrical form (such as a stored charge or voltage) which may be processed, and all such optical sensors are within the scope of the present invention. Optical sensors 1104, 1204 will typically be solid state IC devices, such as a CCD, a charge injection device ("CID"), optical CMOS (passive or active pixel sensors), optical bipolar junction transistors ("BJTs"), photogate or photodiode arrays, any of which may be linear or full frame arrays, have any type of charge or other information readout capability, and may include dark pixels and anti-bloom drains, microlenses, color filter arrays, and so on. In addition, other types of optical sensors utilizing different detector arrays are used in a variety of optical sensor applications. For example, an optical sensor configured to convert brightness variations, captured from a page of text or graphics, into electrical signals may be utilized to perform xerography (i.e., dry copying) commonly associated with photocopiers, scanners and fax machines, discussed in greater detail below. Use of optical sensors in this context enables photoconductivity (i.e., certain substances that are resistant to the passage of electric current become more conductive when exposed to light) to be applied to textual and graphic material to generate the multiple copies of textual and graphic material.

Figure 17:
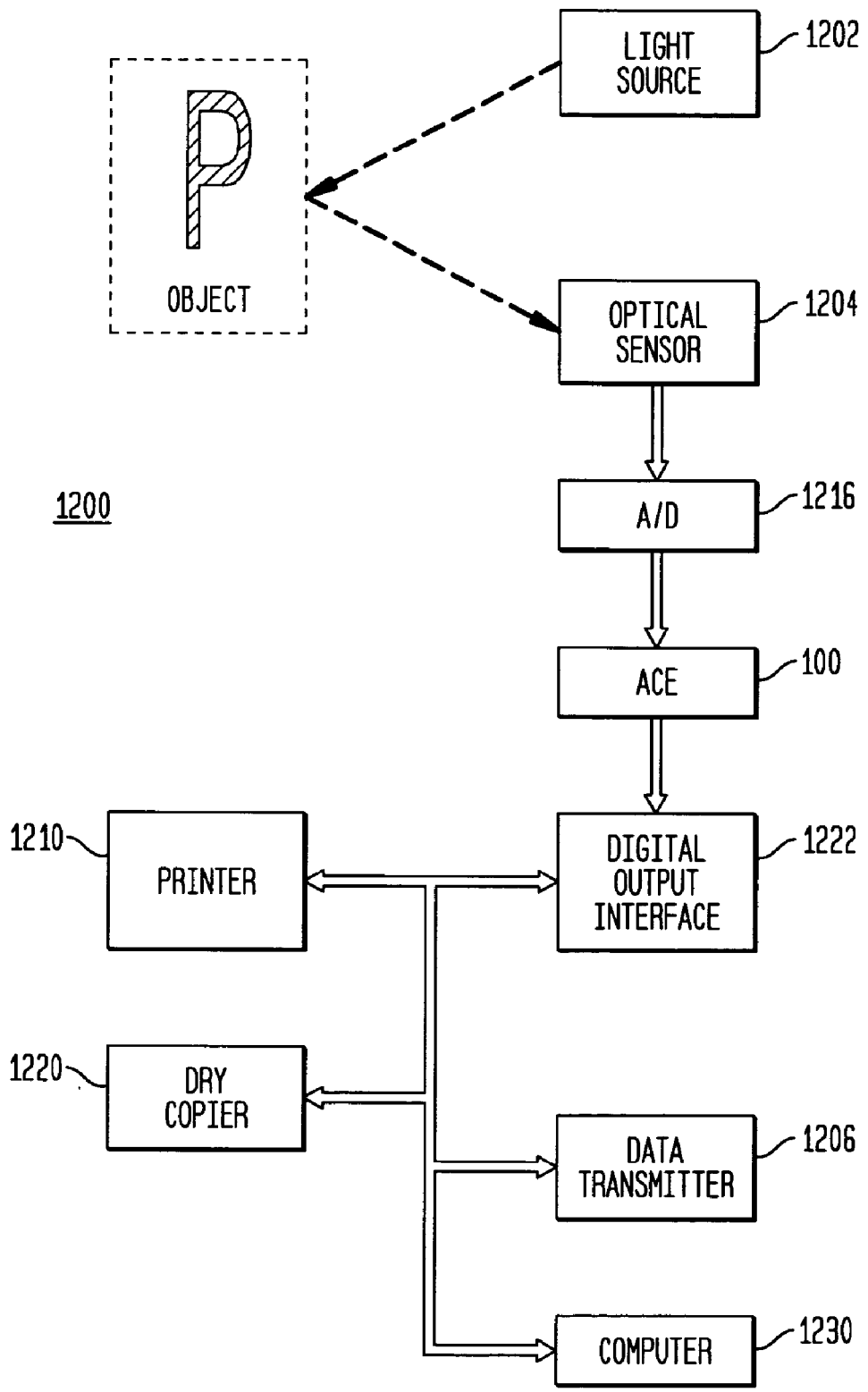
FIG. 17 is a block diagram of an exemplary facsimile, scanner, or photocopier machine in accordance with the present invention.

FIG. 17 is a block diagram of an exemplary facsimile, scanner, or photocopier machine 1200 in accordance with the present invention. The exemplary facsimile/scanner/photocopier machine 1200 utilizes the adaptive computing engine (ACE) 100 (e.g., one or more nodes 800) to process digital image information to produce a processed digital image. Various embodiments also convert the processed digital image for display on a tangible medium, such as by printing or dry copying onto paper. The exemplary facsimile/scanner/photocopier machine 1200 generally includes a light source 1202; an optical sensor 1204; an A/D converter 1216 (which also may be included within the ACE 100); an ACE 100 (e.g., one or more nodes 800); a digital output interface (or port) 1222 (depending upon the selected embodiment); a printer (or printing means) 1210 such as a laser, inkjet or other printer (including a laser, inkjet or other print head, and depending upon the selected embodiment, other printing mechanisms such as a drum-charging electrode, a revolving drum, and so on); a dry copier 1220 (such as xerography or other dry copying mechanisms or means); and a data transmitter 1206 such as an analog, digital, DSL, or cable modem (which also may include an ACE 100) (for faxing or other data transmission). In selected embodiments, the apparatus 1200 may also include focusing mechanisms, as described above.

The various printing mechanisms 1210 or dry copier (xerography) mechanisms 1220 may be implemented as known or as becomes known in the art, and generally include components for storing and feeding paper or other media, collating, user interfacing, and physical image production (e.g., a print head (laser, inkjet), toner cartridges, drum, charging electrode, and so on). The data transmission mechanism 1206 may also include a wireless link (such as a radio frequency (RF) link), a wireline or other bus link, an Ethernet link, or a public network link such as the Internet. The exemplary facsimile/scanner/photocopier machine 1200 may also be coupled to a computer 1230, such as for scanning. It should be noted that there are a wide variety of possible implementations of the exemplary facsimile/scanner/photocopier machine 1200 which are within the scope of the present invention. For these various embodiments, the present invention requires an optical sensor (1104 or 1204) and an ACE 100 (e.g., one or more nodes 800); these components may then be included within one or more printers 1210, dry copiers (or, equivalently, xerography means) 1220, or data transmitters 1206, to form the selected embodiment.

The exemplary facsimile/scanner/photocopier machine 1200 operates to capture an image (and transmit or generate one or more copies of textual or graphic material): the optical sensor 1204 receives (as an object image) light reflected from an object (shown here as a large "P"), using the light source 1202, and registers light and dark areas of the object image as varying voltages (or charges) (to form a detected image). Much like the exemplary digital camera 1100 described in FIG. 16, the voltage (or charge) variations correlate to the light and dark areas captured by an array of light sensitive pixels of the optical sensor 1204, as the detected image. The optical sensor 1204 may be any type of optical sensor as previously discussed with reference to optical sensor 1104. An analog electrical signal output from the optical sensor 1204 is composed of a series of electrical voltages (or charges) representing the brightness variations of the detected image (and corresponding to the brightness variations of the object image). The analog electrical signal is converted to a stream of digital bits by an A/D converter 1216, or a plurality of digital image information data packets, as previously discussed. The stream of digital bits, also referred to herein as the digital image information (or, equivalently, the plurality of digital image information data packets) is then received and processed by the ACE 100 to produce a processed digital image or a plurality of processed digital image data packets (corresponding to the object image projected or reflected onto the optical sensor 1204) suitable for use in faxing, display as a scanned image, for printing or dry copying as a photocopy. As will be appreciated by those of ordinary skill in the art, any of the optical sensor 1204, the ACE 100 or the A/D converter 1216 may be co-located or integrated on the same semiconductor (IC) as a system on a chip ("SOC") embodiment or on several ICs coupled on a circuit board (e.g., a printed circuit board).

Upon completion of processing by the ACE 100, the processed digital image (from either apparatus 1100 or 1200) may be physically embodied on a tangible medium or otherwise displayed through a wide variety of mechanisms, including printed via printer 1210 and dry copied via dry (xerography) copier 1220, or transmitted via the data transmission mechanism 1206 to any number of locations for use in any number of applications. For example, the processed digital image may be transmitted to a receiving end of a remote facsimile machine, to a printer, to a wireless cell phone, to a computer for display on a computer screen, or to a network (such as the Internet). Also for example, the data transmission mechanism 1206 may include one or more modems 1304, a radio frequency (RF) link 1306, a wired bus link 1308, an Ethernet link 1310, or a public network link 1312 such as the Internet. A receiving device may include one or more computers 1314 that may be a laptop, a desktop, or a handheld computer, a wireless cell phone 1316, a printer 1318, or a receiving facsimile machine 1320, or any other device that displays or prints the final copy (from the processed digital image) corresponding to the object image (and, presumably, the object).

For example, referring again to FIG. 17, if the receiving device is the receiving facsimile machine, a laser beam turns on and off in response to the incoming stream of digital bits (representing the processed digital image), discharging areas of a revolving drum, previously charged by the drum-charging electrode, that correspond to light areas of the image. A pixilated final copy of the original object image is reproduce on a medium, for example, paper, output at the receiving end. It will be apparent to those of skill in the art that any suitable type of printing or xerography (dry copying) means may be utilized, and all are within the scope of the present invention.

In general, in accordance with the present invention, an optical sensor for detecting an object image, such as capturing an object image of a scene or textual or graphic material, may be used in conjunction with an ACE 100 for generating a processed digital image in any digital imaging application, including still and moving image photography, printing, scanning, copying, television, video, video telephony, digital TV, digital cinema, and so on. As indicated above, although the analog-to-digital converters 1118 and 1216 are illustrated separately, it is contemplated that the conversion of the optical sensor output (the detected image) to digital image information may be performed by an A/D converter co-located or integrated with the ACE 100 on the same IC or SOC. In addition, depending upon the type of optical sensor utilized, the optical sensor may also be co-located or integrated on the same IC with the ACE 100 and/or A/D converter. For example, the various nodes 800 comprising an ACE 100 may be co-located or integrated with an optical sensor and A/D converter at the root level (illustrated in FIG. 11), with the digital image information (output from the A/D converter) embodied in the form of data packets transmitted on the MIN 110. In other embodiments, the optical sensor (potentially with the A/D converter) may be or considered to be one or more fixed function nodes 800 (e.g., comprised of a plurality of optical sensing and A/D converting computational elements 250) which are used in conjunction with one or more reconfigurable nodes 800 that perform digital image processing. (As a fixed function optical node, however, the optical sensor may not require many of the components of the node wrapper discussed above.) It is also contemplated that optical sensors may be developed which directly provide a quantized, digital readout, which are also within the scope of the present invention.

In these various integrated (SOC) or non-integrated embodiments, it is implicit herein that the optical sensor may produce either an analog output (when embodied solely as a CCD or optical CMOS, for example) or a digital output (when embodied in combination as a CCD or optical CMOS integrated with A/D conversion functionality). As a consequence, as used herein, the optical sensor may be considered more generally to convert an object image (such as from the focusing means or reflected from an object) to "image information" suitable for further processing by a configured and reconfigured plurality of computational elements; in the event the image information is analog, then intervening A/D conversion is implicit (transforming an analog detected image into digital image information). In addition, to provide the processed digital image suitable for one or more imaging applications, such as digital photography, copying or printing, using the image information (or digital image information), the plurality of computational elements are configured for a first imaging function or algorithm, and reconfigured for performance of a second imaging function or algorithm, with the first imaging function or algorithm being different than the second imaging function or algorithm.

Image sensing, or photo-detection, performed by the optical sensor 1104, 1204 is generally accomplished by an array of millions of light-sensitive cells commonly referred to as pixels or picture elements ("pels") that convert light into varying analog electrical signals represented as a series of electrical charges (or voltages). Each light-sensitive cell of the array of millions detects an amount of light from (or corresponding to) an object image. In color applications, the light-sensitive cell will detect an amount of light corresponding to a particular color (or frequency band) as well. As a result, the analog electrical signals produced by the optical sensor 1104, 1204 correspond to the varying amount of light that strikes the array of light-sensitive cells. After detecting the light, the optical sensor 1104, 1204 transfers the electrical charges in a sequential fashion to an output amplifier of the optical sensor (discussed below), which is subsequently converted to a digital image information stream (or a plurality of digital image information data packets) and ultimately processed by the ACE 100.

The central building block of the optical sensor 1104, 1204 is generally a metal insulator semiconductor material. In one embodiment, the optical sensor 1104, 1204 utilizes a complementary metal-oxide semiconductor (CMOS) IC that may be configured to include, for example, either an array of photodiodes or an array of photogates. When light falls on the light sensitive pixels of the optical sensor 1104, 1204, energy (in the form of photons) is absorbed which then releases or provides excited electrons in the semiconductive silicon layer. The more intense the light on a pixel, the more electrons are released and the bigger the resulting charge for that pixel.

The charges (or voltages) from each pixel are then read out (or moved) from the array into corresponding registers, depending upon the type of array (such as linear or full frame), such as reading out columns, transferring charge from one gate to the next per clock cycle, and into a horizontal serial readout row register, for example. This is accomplished by manipulating gate voltages of the array (columns and rows of CMOS gates) in a systematic manner, causing the electrons to be transferred from one gate to the next, in a sequential fashion. At the end of each column of CMOS gates, the horizontal rows of pixels are collected one row at a time by the serial readout row register and then transported to an output amplifier (to provide an amplified output) for subsequent conversion to digital information (e.g., by an A/D converter 1118, 1216). This process creates a serial data stream, digital image information, that represents a two dimensional image associated with the image being photographed, copied or transmitted. In the various embodiments, this digital image information also may be provided in data packets, as a plurality of digital image information data packets, for transmission on the MIN 110 to various nodes 800, such as in the data payload portion of the exemplary data structure illustrated in FIG. 14.

For example, for a CCD having a 3×3 array of image pixels with three MOS gates per image pixel, an electronic image is created on the nine pixels when the CCD is illuminated. Next, each of the columns of the 3×3 array are shifted down in parallel, one gate at a time, one clock pulse at a time. After reaching the serial readout row register, the pixels are shifted out to the output amplifier, one row at a time. The entire serial row is clocked out before the next row of pixel contents (i.e., charges) is transferred into the serial readout row register. This process continues until charge transfer of all of the image pixels to the output amplifier is complete.

Although the optical sensor described above is a simple pixel array of columns and rows, the optical sensor 1104, 1204 may also be configured as a linear one-line array, a full frame transfer array, a frame transfer array (i.e., two identical arrays; one for image pixels, one for storage), or a interline transfer array (i.e., photodiodes separated by vertical transfer registers). Further, optical sensors 1104, 1204 can be fabricated using any suitable technology with any suitable transistor structure such as, for example, a neuron-bipolar junction transistor (vBJT) structure or a silicon on sapphire CMOS structure.

For ease of discussion, the exemplary digital camera 1100 of FIGS. 16A and 16B will be used to illustrate a number of ACE 100 configurations that can be used in conjunction with optical sensors to produce a processed digital image, with corresponding operation occurring in the exemplary facsimile, scanner, or photocopier machine 1200. As will be appreciated by those of ordinary skill in the art, however, other devices that utilize optical sensors in their operation may be similarly configured with an ACE 100, such as a facsimile device, copier, scanner, projector, video camera, etc.

Referring again to operation of the exemplary digital camera 1100 of FIGS. 16A and 16B, upon completion of analog processing (the charge read-out and amplification discussed above), the detected image (as the optical sensor 1104 output) is converted into digital image information by the analog-to-digital converter 1118. The analog-to-digital converter 1118 samples and quantizes the optical sensor output to convert the analog electrical signal into digital image information (i.e., a series of high and low voltages, or logic 1's and 0's, which may be a serial bit stream or one or more digital image information data packets). The digital image information is then processed by the ACE 100 (discussed below) to produce a processed digital image (or, equivalently, a plurality of processed digital image data packets) suitable for use in any number of applications, for example, in a digital camera application, a copying application, a printing application, a faxing or other data transmission application, and so on, where it may be displayed or stored on a tangible medium, such as displayed on a computer screen, displayed on a television screen, saved to the memory 1112, stored on a CD or disk, viewed on the viewfinder screen 1106, printed as a photograph by a laser or inkjet printer, dry copied onto paper, or transmitted over a wireline or wireless link, and so on. As mentioned above, when the processed digital image is provided as a plurality of processed digital image data packets, the packets may be assembled to form the processed digital image for use in any of these applications, such as through a digital output interface, or directly by the application.

The processed digital image may also be used in multi-frame applications (e.g., moving image photography, a video cassette recorder (VCR)), multichannel applications (e.g., positron emission tomography (PET) scans), or it may be transmitted to a remote receiver for remote display via a facsimile machine, a computer, etc.

Referring again to FIGS. 16A and 16B, if provided in the exemplary digital camera 1100, an autofocus system also utilizes the optical sensor 1104 and the ACE 100 to cause a small motor (not separately illustrated) to adjust or move the focusing means 1102 to automatically provide a focused object image as input to the optical sensor 1104. Utilizing digital image information provided by the A/D converter 1118 (and the optical sensor 1104), the ACE 100 first detects "edge points" (i.e., areas with a large change in contrast, such as where a white shirt meets a black background). At the edge points, one pixel will have one value (e.g., representing black) while an adjacent pixel will have a very different value (e.g., representing white). Based on the values associated with the detected edge points, the ACE 100 causes the motor to adjust the focusing means 1104 so that the difference between the values at the edges is maximized. In other words, an incorrect adjustment to the focusing means 1104 (e.g., adjusting in from the image rather than out towards the image) by the ACE 100, would yield a smaller difference between the values of the adjacent pixels.

In addition, if provided in the exemplary digital camera 1100 of FIGS. 16A and 16B (or any other apparatus having an optical sensor and an ACE 100), an optical image stabilizer system utilizes the ACE 100 coupled to a motion sensor (not separately illustrated) to cause a lens actuator (not separately illustrated) to move the lens 1104 up or down, or from side-to-side, to compensate for camera movements.

In general, because of imperfections in the image capturing or detection process, without additional processing, the recorded image usually represents a distorted or degraded version of the original image or object. As a consequence, image enhancement is generally needed in the imaging process as an image is converted from one form to another, from acquisition of the object image to generation of the processed digital image, as many types of distortions, artifacts, noise or noise-like degradations can be introduced into the image (e.g., as the image is acquired, copied, scanned, digitized, transmitted, displayed, printed, or compressed). For instance, various distortions are introduced in image detection, and when the detected image (as an analog signal) is converted by the A/D converter 1118, the resulting digital signal generally contains quantization distortion or noise. Similarly, when an image is transmitted through a communication channel, the received image contains channel noise, and so on. Thus, as used herein, the term "image enhancement" refers to one or more processes, functions or algorithms applied to the recorded image (such as to the detected image or the digital image information) which enhances or highlights some aspect of the information contained in the image, or which minimizes irregularities (e.g., blurring), distortions or noise due to errors in signal acquisition that may have corrupted the image.

Because the various nodes 800 can be tailored to perform one or more selected algorithms, the ACE 100 may be configured to perform many of the image detection, restoration and enhancement functions or operations useful in digital imaging applications such as in cameras, facsimile machines, copier machines, etc. The ACE 100 may be configured to perform a number of image restoration algorithms (e.g., deblurring, debugging) including, for example: (1) linear filtering utilizing low pass filters to suppress high frequency noise; (2) non-linear filtering utilizing morphologic and median filters to reduce distortion in (de-noise) the image; and (3) wavelet-based distortion reduction utilizing multirate filter banks. In wavelet-based distortion reduction, a discrete wavelet transform ("DWT") compacts image energy into a small number of DWT coefficients having large amplitudes, spreads the energy of the noise over a large number of DWT coefficients having small amplitudes, and removes the noise and other distortions via an adjustable threshold filter.

For instance, underexposure and low-light conditions in photography lead to images with "grain noise", which, together with the image signal itself, are captured during the digitization process. The grain noise is generally present because of some physical randomness of image acquisition systems using optical sensors 1104. Linear filtering image enhancement may be used to remove such distortions and other noise, as discrete-space image signals can be expressed as a sum of weighted, shifted impulses with each weighted impulse comprising one of the pixels of the image. The nodes 800 of the ACE 100 can be configured to filter out the noise from the impulses to yield a less distorted image.

Also for example, one or more of the nodes 800 can be configured to perform low pass filtering to reject the high frequency content of white noise or broadband noise responsible for image corruption. The nodes 800 may also be configured to provide ideal low-pass filtering or Gaussian filtering for the digitized image. Further, due to temporal nature of the ACE 100, the filtering capability of the ACE 100 can be virtually "real-time" optimized, depending on the image conditions, to perform filtering and minimize image content degradation.

In another example, one or more of the nodes 800 may be configured to provide weighted median ("WM") filters for non-linear filtering, or smoothing, of the digitized image to improve the appearance of the image. In general, rather than using linear combinations of pixel values within a local window, WM filters use the local weighted median. By selecting an appropriate configuration for the computational elements 250 and configuring the computational units 200 and interconnect to achieve a median filter configuration, the ACE 100 can provide impulse noise removal (e.g., by a center WM filter where not all samples are equally weighted), image enlargement and zooming with little edge degradation, and image analysis including execution of edge-detection algorithms. Further, center weighted median smoothing may be provided by the ACE 100 (configured with weighted median filters) which allows for emphasizing and deemphasizing specific input samples. The center sample of a window is emphasized by tuning the center weight, while keeping the weighted values of all other samples at unity. This concept can be extended to include color images via the inclusion of vector weighted median filters in the ACE 100.

In yet another example, one or more of the nodes 800 may be configured to provide morphological filters for image detection and enhancement, otherwise known as morphological image processing. Morphological image detection and enhancement refers to a broad collection of nonlinear filters (e.g., morphological filters), design methodologies, and algorithms to enhance the visibility and perceptibility of the various regions into which an image can be partitioned. Essentially, the mathematical morphology for image analysis aims to quantitatively describe the geometrical structure of image objects. For example, morphological filters (i.e., morphological signal transformation) which are more suitable than linear filter for shape analysis, play a major role for geometry-based enhancement and detection. Morphological filters are also well suited for non-Gaussian noise suppression.

In some cases, the images acquired by the optical sensor 1104 are used in multichannel or multiframe applications where, after digital processing, the multiple frames or channels are assembled, or recovered, to form a restored image. Accordingly, the nodes 800 of the ACE 100 may be configured to perform multichannel image recovery algorithms for multichannel image applications (i.e., applications where a there is a collection of images that are not identical but exhibit strong between-channel correlations). Such image recovery algorithms compute an image from observed data that alone does not uniquely define the desired image. Multichannel image recovery algorithms may include algorithms for image distortion reduction (de-noising), image deblurring, decoding of compressed images, and medical image reconstruction. For example, implicit multichannel recovery can be performed by the ACE 100 to provide multichannel reconstruction of medical image sequences obtained using positron emission tomography (PET).

Similarly, the nodes 800 of the ACE 100 may be configured to perform multiframe image restoration algorithms to improve imagery acquired in the presence of varying degradations due to, for example, undersampling image data acquired by the optical sensor 1104. Undersampling may result from a tradeoff between the field of view and the pixel size, as the pixel size for the CCD 1104 becomes larger as the field of view increases. A microscanning algorithm, where a sequence of undersampled image frames is processed to restore image resolution, is one type of multiframe image restoration algorithm that may be performed by the ACE 100 to overcome possible undersampling problems.

Other algorithms that may be provided or performed by the ACE 100 include, without limitation, iterative image restoration algorithms, motion detection and estimation algorithms for recorded images sequences (e.g., video, moving images captured with a still digital camera), video enhancement and restoration algorithms, 3D reconstruction, and image sequence stabilization algorithms. As will be appreciated by those of ordinary skill in the art, the type or kind of image processing for which the ACE 100 may be configured is virtually limitless, and all such image processing algorithms for performance by one or more nodes 800 of the ACE 100 are within the scope of the present invention.

In summary, the present invention provides a digital imaging apparatus which may be embodied, for example, as a digital camera, a scanner, a printer, a dry copier, or otherwise utilized in digital imaging applications. The digital imaging apparatus of the invention includes an optical sensor, an analog-to-digital converter, a plurality of computational elements, and an interconnection network. The optical sensor is capable of converting an object image into a detected image. The analog-to-digital converter is coupled to the optical sensor and is capable of converting the detected image to digital image information. The plurality of computational elements includes a first computational element having a first fixed architecture and a second computational element having a second fixed architecture, with the first fixed architecture being different than the second fixed architecture. The interconnection network is coupled to the plurality of computational elements and to the analog-to-digital converter, and is capable of providing a processed digital image from the digital image information by configuring the plurality of computational elements for performance of a first imaging function of a plurality of imaging functions in response to first configuration information, and by reconfiguring the plurality of computational elements for performance of a second imaging function of the plurality of imaging functions in response to second configuration information, with the first imaging function being different than the second imaging function.

The digital imaging apparatus may also include focusing means capable of providing the object image to the optical sensor, such as a focusing assembly having a lens, a shutter, an aperture, and a focusing motor. The optical sensor is at least one of a plurality of optical sensors, such as a charge coupled device (CCD), a charge injection device (CID), an optical complementary metal oxide silicon (CMOS) array, an optical bipolar junction transistor (BJT) array, a photogate array, or a photodiode array.

The digital imaging apparatus, in various embodiments, may also include an analog output interface coupled to the interconnection network, the analog output interface capable of converting the processed digital image to an analog form; a viewfinder screen coupled to the analog output interface, the viewfinder screen capable of visually displaying the analog form of the processed digital image; and an analog output port coupled to the analog output interface, the analog output port capable of outputting the analog form of the processed digital image, such as for connection to a television or other video display. The digital imaging apparatus may also include a digital output port coupled to the interconnection network, the digital output port capable of outputting the processed digital image, such as for connection to a computer or a data transmission device.

The processed digital image may also be provided as a plurality of processed digital image data packets. In this embodiment, the digital imaging apparatus may also include a digital output interface coupled to the interconnection network, with the digital output interface capable of selecting a plurality of processed digital image data words from the plurality of processed digital image data packets and assembling the plurality of processed digital image data words to form the processed digital image.

The digital imaging apparatus also may be included within or coupled to, for example: a printer capable of printing the processed digital image on a tangible medium; a dry copier capable of transferring the processed digital image to a tangible medium; a data transmitter capable of transmitting the processed digital image to a remote location; a scanner capable of transferring the processed digital image to a storage medium, to a computer, and so on.

In the various embodiments, the plurality of imaging functions may include one or more of the following functions: linear filtering; nonlinear filtering; morphological filtering; median filtering; local weighted median filtering; center weighted median filtering; vector weighted median filtering; multichannel image recovery; multiframe image restoration; iterative image restoration; motion detection; motion estimation; low pass filtering; multirate filtering; wavelet-based multirate filtering; autofocusing; contrast enhancement; blur removal.

Also in the various embodiments, the first fixed architecture and the second fixed architecture of the a plurality of computational elements may be selected from a plurality of specific architectures, such as those architectures having the following corresponding functions: linear filtering, non-linear filtering, memory, addition, multiplication, complex multiplication, subtraction, synchronization, queuing, over sampling, under sampling, adaptation, configuration, reconfiguration, control, input, output, and field programmability.

Various types of memory may be included within the digital imaging apparatus. For example, a first memory may be couplable to the interconnection network and capable of storing the processed digital image, and this first memory may be a selectively removable flash memory. A second memory may also be included, coupled to the interconnection network, and be capable of storing the first configuration information and the second configuration information, such as synchronous dynamic random access memory (SDRAM).

Also in summary, in another embodiment, the digital imaging apparatus includes an optical sensor, an analog-to-digital converter, an input pipeline register, a first memory, a hardware task manager, a data distributor, an adaptive execution unit, a data selector, and an output pipeline register. The optical sensor is also capable of converting an object image into a detected image. The analog-to-digital converter is coupled to the optical sensor and is capable of converting the detected image to a plurality of digital image information data packets. The input pipeline register is coupled to the analog-to-digital converter and is capable of receiving the plurality of digital image information data packets, while the first memory is capable of storing the plurality of digital image information data packets. The hardware task manager is capable of processing a plurality of imaging tasks and determining that a first imaging task from the plurality of imaging tasks is capable of being performed and that a second imaging task from the plurality of imaging tasks is capable of being performed, with the first imaging task being different than the second imaging task. The data distributor is coupled to the input pipeline register, to the first memory, and to the hardware task manager, and is capable of distributing the plurality of digital image information data packets to the first memory. The adaptive execution unit is coupled to the hardware task manager and to the first memory, and is capable of configuring to perform the first imaging task and capable of performing the first imaging task using the plurality of digital image information data packets, the adaptive execution unit further capable of reconfiguring to perform the second imaging task and capable of performing the second imaging task, and the adaptive execution unit further capable of generating a corresponding plurality of processed digital image data packets from the performance of the first imaging task and the second imaging task. The data selector is coupled to the hardware task manager, to the adaptive execution unit and to the first memory, and is capable of determining routing for the corresponding plurality of processed digital image data packets. The output pipeline register is coupled to the data selector, and is capable of receiving the corresponding plurality of processed digital image data packets.

In this embodiment, the adaptive execution unit includes a plurality of computational elements and a plurality of switching elements coupled to the plurality of computational elements. In the plurality of computational elements, a first computational element has a first fixed architecture and a second computational element has a second fixed architecture, with the first fixed architecture being different from the second fixed architecture. The plurality of switching elements are capable of configuring the plurality of computational elements for performance of a first imaging function of a plurality of imaging functions in response to first configuration information, and are further capable of reconfiguring the plurality of computational elements for performance of a second imaging function of the plurality of imaging functions in response to second configuration information, with the first imaging function being different than the second imaging function.

Numerous advantages of the present invention may be readily apparent to those of skill in the art. First, the reconfigurability of the computational elements to perform a plurality of different imaging or optical functions and algorithms readily allows for ready implementation of any new or changed algorithms. Second, once a particular configuration is in place for the performance of an imaging optical algorithm, the various nodes have a very high efficiency and corresponding low latency, comparable to that of an ASIC, while maintaining flexibility of implementation. In addition, the present invention is also capable of implementations which provide considerable savings of IC area and power consumption.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A digital imaging apparatus comprising:
   an input pipeline register receiving a plurality of digital image information data packets;
   a first memory storing the plurality of digital image information data packets;
   a hardware task manager processing a plurality of imaging tasks and determining that a first imaging task is capable of being performed and that a second imaging task is capable of being performed, the first imaging task being different than the second imaging task;
   a data distributor coupled to the input pipeline register, to the first memory, and to the hardware task manager, the data distributor distributing the plurality of digital image information data packets to the first memory;
   an adaptive execution unit coupled to the hardware task manager and to the first memory, the adaptive execution unit configurable to perform the first imaging task using the plurality of digital image information data packets, the adaptive execution unit further reconfigurable to perform the second imaging task, the adaptive execution unit further generating a corresponding plurality of processed digital image data packets from the performance of the first imaging task and the second imaging task;
   a data selector coupled to the hardware task manager, to the adaptive execution unit and to the first memory, the data selector determining routing for the corresponding plurality of processed digital image data packets; and
   an output pipeline register coupled to the data selector, the output pipeline register receiving the corresponding plurality of processed digital image data packets.

2. The digital imaging apparatus of claim 1, wherein the adaptive execution unit comprises:
   a plurality of computational elements, a first computational element of the plurality of computational elements having a first fixed architecture and a second computational element of the plurality of computational elements having a second fixed architecture, the first fixed architecture being different from the second fixed architecture;
   a plurality of switching elements coupled to the plurality of computational elements, the plurality of switching elements capable of configuring the plurality of computational elements for performance of a first imaging function of a plurality of imaging functions in response to first configuration information, and the plurality of switching elements further capable of reconfiguring the plurality of computational elements for performance of a second imaging function of the plurality of imaging functions in response to second configuration information, the first imaging function being different than the second imaging function.

3. The digital imaging apparatus of claim 2, wherein the plurality of switching elements are comprised of a plurality of multiplexers, a plurality of demultiplexers, and a plurality of routing elements.

4. The digital imaging apparatus of claim 1, wherein the input pipeline register receives the plurality of digital image information data packets, each digital image information data packet of the plurality of digital image information data packets containing a plurality of fields, the plurality of fields comprising a first data field for routing information; a second data field for security information; a third data field for a service code, the service code designating an acknowledgement message, a memory read, a memory write, a memory move, or a memory address; a fourth data field for an auxiliary code having a task designation; and a fifth data field for a digital image information data word.

5. The digital imaging apparatus of claim 1, wherein the hardware task manager produces a task queue of a plurality of imaging tasks for execution by the adaptive execution unit.

6. The digital imaging apparatus of claim 1, further comprising:
   an optical sensor converting an object image into a detected image; and
   an analog-to-digital converter coupled to the optical sensor, the analog-to-digital converter converting the detected image to the plurality of digital image information data packets.

7. The digital imaging apparatus of claim 6, further comprising: a focusing device including one of a lens; a shutter; an aperture; and a focusing motor.

8. The digital imaging apparatus of claim 6, wherein the optical sensor is at least one of a plurality of optical sensors, the plurality of optical sensors comprising: a charge coupled device (CCD), a charge injection device (CID), an optical complementary metal oxide silicon (CMOS) array, an optical bipolar junction transistor (BJT) array, a photogate array, or a photodiode array.

9. The digital imaging apparatus of claim 6, further comprising: a light source capable of providing light for reflection from an object to form the object image.

10. The digital imaging apparatus of claim 1, further comprising:
    an analog output interface coupled via an interconnection network to the output pipeline register, the analog output interface capable of converting the plurality of processed digital image data packets to an analog form of a processed digital image; and
    a viewfinder screen coupled to the analog output interface, the viewfinder screen capable of visually displaying the analog form of the processed digital image.

11. The digital imaging apparatus of claim 1, further comprising:
    an analog output interface coupled via an interconnection network to the output pipeline register, the analog output interface capable of converting the plurality of processed digital image data packets to an analog form of a processed digital image; and an analog output port coupled to the analog output interface, the analog output port capable of outputting the analog form of the processed digital image.

12. The digital imaging apparatus of claim 1, further comprising: a digital output interface coupled to the output pipeline register, the digital output interface capable of selecting a plurality of processed digital image data words from the plurality of processed digital image data packets and assembling the plurality of processed digital image data words to form a processed digital image.

13. The digital imaging apparatus of claim 12, further comprising: a second memory couplable via an interconnection network to the digital output interface, the second memory capable of being selectively removable, the second memory capable of storing the processed digital image.

14. The digital imaging apparatus of claim 12, further comprising: a digital output port coupled to the digital output interface, the digital output port capable of outputting the processed digital image.

15. The digital imaging apparatus of claim 14, further comprising: a printer coupled to the digital output port, the printer capable of printing the processed digital image on a tangible medium.

16. The digital imaging apparatus of claim 14, further comprising: a dry copier coupled to the digital output port, the dry copier capable of transferring the processed digital image to a tangible medium.

17. The digital imaging apparatus of claim 14, further comprising: a data transmitter coupled to the digital output port, the data transmitter capable of transmitting the processed digital image to a remote location.

18. The digital imaging apparatus of claim 1, further comprising: a digital output port coupled to the output pipeline register, the digital output port capable of selecting a plurality of processed digital image data words from the plurality of processed digital image data packets and assembling the plurality of processed digital image data words to form a processed digital image, the digital output port further capable of outputting the processed digital image.

19. The digital imaging apparatus of claim 1, wherein the plurality of imaging tasks provide for performance of at least two of the following functions: linear filtering; nonlinear filtering; morphological filtering; median filtering; local weighted median filtering; center weighted median filtering; vector weighted median filtering; multichannel image recovery; multiframe image restoration; iterative image restoration; motion detection; motion estimation; low pass filtering; multirate filtering; wavelet-based multirate filtering; autofocusing; contrast enhancement; blur removal.

20. The digital imaging apparatus of claim 1, wherein the digital imaging apparatus is embodied as at least one integrated circuit.

* * * * *

UNITED STATES PATENT AND TRADEMARK OFFICE
CERTIFICATE OF CORRECTION

| | |
|---|---|
| PATENT NO. | : 7,961,226 B2 |
| APPLICATION NO. | : 12/560018 |
| DATED | : June 14, 2011 |
| INVENTOR(S) | : Paul L. Master and John Watson |

It is certified that error appears in the above-identified patent and that said Letters Patent is hereby corrected as shown below:

Title Page,
In the Title, item [54]
Change "SYSTEM FOR ADAPTING DEVICE STANDARDS AFTER MANUFACTURE" to
--DIGITAL IMAGING APPARATUS--

Signed and Sealed this
Ninth Day of August, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,961,226 B2 | Page 1 of 1 |
| APPLICATION NO. | : 12/560018 | |
| DATED | : June 14, 2011 | |
| INVENTOR(S) | : Paul L. Master and John Watson | |

It is certified that error appears in the above-identified patent and that said Letters Patent is hereby corrected as shown below:

Title Page, Item (54) and at Column 1, lines 1 and 2,
    In the Title,
    Change "SYSTEM FOR ADAPTING DEVICE STANDARDS AFTER MANUFACTURE" to
        --DIGITAL IMAGING APPARATUS--

This certificate supersedes the Certificate of Correction issued August 9, 2011.

Signed and Sealed this
Thirtieth Day of August, 2011

David J. Kappos
*Director of the United States Patent and Trademark Office*